US006323415B1

(12) United States Patent
Uematsu et al.

(10) Patent No.: US 6,323,415 B1
(45) Date of Patent: Nov. 27, 2001

(54) LIGHT CONCENTRATOR PHOTOVOLTAIC MODULE METHOD OF MANUFACTURING SAME AND LIGHT CONCENTRATOR PHOTOVOLTAIC SYSTEM

(75) Inventors: Tsuyoshi Uematsu, Kodaira; Terunori Warabisako, Tokyo; Yoshiaki Yazawa, Hoya; Yoshinori Miyamura; Ken Tsutsui, both of Tokyo; Shin-ichi Muramatsu, Kodaira; Hiroyuki Ohtsuka, Hachioji; Junko Minemura, Kokubunji, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/398,043

(22) Filed: Sep. 17, 1999

(30) Foreign Application Priority Data

Sep. 18, 1998 (JP) ................................................. 10-264282

(51) Int. Cl.⁷ ..................................................... H01L 25/00
(52) U.S. Cl. ............................................................. 136/246
(58) Field of Search ............................................. 136/246

(56) References Cited

U.S. PATENT DOCUMENTS

| 4,235,643 | * | 11/1980 | Amick | 136/246 |
| 5,554,229 | * | 9/1996 | Vogeli | 136/259 |
| 5,994,641 | | 11/1999 | Kardauskas | 136/246 |
| 6,008,449 | | 12/1999 | Cole | 136/246 |

OTHER PUBLICATIONS

"V–Groove Faceted Reflector for Enhanced Module Output", J. Amick et al, CH1644–4/81/0000–1376, 1981 IEEE, pp. 1376–1381.

* cited by examiner

Primary Examiner—Mark Chapman
(74) Attorney, Agent, or Firm—Antonelli, Terry, Stout & Kraus, LLP

(57) ABSTRACT

A light concentrator photovoltaic module includes a medium having a light receiving plane, a plurality of photovoltaic elements arranged in a spaced relationship with the light receiving plane, and a light reflecting plane for conducting light incident upon the light receiving plane but is not directly received by the photovoltaic elements to the photovoltaic elements. The light reflecting plane has a structure as viewed on a cross section in a plane transverse to the module light receiving plane and traversing adjacent two photovoltaic elements and a light reflecting member therebetween such that the light reflecting plane includes, at least two first inclined planes and at least two second inclined planes, the first inclined planes being rightwardly ascending while the second inclined planes are leftwardly ascending, respectively, at least two first inclined planes being arranged on a right side of a middle point of a distance between the adjacent two photovoltaic elements while at least two second inclined planes being arranged on a left side of the middle point.

21 Claims, 24 Drawing Sheets

LIGHT CONCENTRATOR PHOTOVOLTAIC MODULE METHOD OF MANUFACTURING SAME AND LIGHT CONCENTRATOR PHOTOVOLTAIC SYSTEM

BACKGROUND OF THE INVENTION

The present invention relates to a light concentrator photovoltaic module and a light concentrator photovoltaic system.

A light concentrator photovoltaic module, which includes photovoltaic elements and a light reflecting plane, has been disclosed in, for example, JP-A-60-128678 (laid open on Jul. 9, 1985). FIG. 1A illustrates substantially the same structure as that illustrated in this reference. A portion of a light reflecting plane 75 composed of aluminum protrudes between photovoltaic elements 74 toward a module light-receiving plane 72. This protruding portion includes two inclined planes. A reflection light beam of a light beam 71 incoming onto an inclined plane on the right side is caused to enter the photovoltaic element 74 existing on the right side of the inclined planes. Similarly, a reflection light beam of a light beam 71 incoming onto an inclined plane on the left side is caused to enter the photovoltaic element 74 existing on the left side of the inclined planes. These operations concentrate, onto the photovoltaic elements 74, the light beams incoming into the region where the photovoltaic elements 74 do not exist in the module.

FIG. 2 illustrates substantially the same structure as that of a light concentrator photovoltaic module disclosed in JP-A-60-116180 (laid open on Jun. 22, 1985). Pits and projections are provided in a portion between photovoltaic elements 84 of a light reflecting plane 85 composed of a metal. Incident light beams 81 undergo irregular reflection by the pits and projections, and the resultant scattered light beams are collected into the photovoltaic elements 84. This operation concentrates, onto the photovoltaic elements 84, the light beams incoming into the region where the photovoltaic elements 84 do not exist in the module. An example similar to this where the scattered light beams are used are disclosed also in "Sharp Technical Report", April 1998, No. 70, pp. 69–70.

SUMMARY OF THE INVENTION

Referring to FIG. 1B drawn for explaining the conventional technique illustrated in FIG. 1A, the light beams that have entered the module light receiving plane 72 include light beams 71-3, 71-4, 71-5 incoming directly into the photovoltaic element 74 and light beams 71-1, 71-2 incoming into the solar photovoltaic element 74 after reflection on the light reflecting plane 75. The light beams 71-3, 71-4, 71-5 incoming directly enter all the regions (i.e., region a and region b) on the photovoltaic element 74. Meanwhile, the light beams 71-1, 71-2 incoming after reflection enter only the region b that is situated farther from the light reflecting plane 75.

Accordingly, it is desirable to enhance a light collection efficiency of the entire photovoltaic element 74 that include the region a and the region b.

Here, the light collection efficiency and a concentration ratio are defined by the following formulae (1) and (2), respectively.

light collection efficiency=amount of incident light into photovoltaic element/amount of incident light into module light receiving plane  (1)

concentration ratio=area of module light receiving plane/light receiving area of photovoltaic element  (2)

Here, for example, solar batteries identical with each other or different solar batteries having almost equal spectral sensitivities are located at a setting position of the module light-receiving plane 72 and at a setting position of the photovoltaic element 74. Values of short-circuit currents in these solar batteries at the time of the light irradiation may be employed as the amount of incident light in the formula (1). At this time, a light reflectance on the surface of any one of the solar batteries differs, depending on whether the surface is in contact with the air or in contact with a medium with a refractive index larger than that of the air. Thus, the substantial spectral sensitivity is varied. Consequently, at the measurement of the short-circuit currents, it is desirable to correct the variations in the spectral sensitivities of the solar batteries.

Also, concerning the light receiving area of the solar photovoltaic element in the formula (2), when the photovoltaic element is flat board-shaped, the light receiving area is assumed to be equal to the area of the flat board. When the photovoltaic element is rectangular parallelepiped, rod-shaped, or spherical, the light receiving area is assumed to be equal to the projection area of the light receiving plane thereof onto the module light-receiving plane. Consequently, in a double-sided light receiving type photovoltaic element on the front and the back of which light receiving planes with an equal area are formed, the light receiving area thereof does not become equal to a summation of the areas of the front and the back light receiving planes but becomes equal to one-half of the summation.

Incidentally, in FIG. 1B, in order for the light beams reflected by the light reflecting plane 75 to undergo total internal reflection on the module light-receiving plane 72 and then to enter the photovoltaic element 74, the following condition will have to be met: Making large enough an angle θ3, i.e. an angle which a plane 78 parallel to the module light receiving plane 72 forms with the inclined plane of the light reflecting plane 75, so that incident angles onto the module light receiving plane 72 of the light beams reflected on the inclined plane will become equal to the critical angle (θ5) or larger. A refractive index of a glass or a transparent plastic commonly used as a medium 73 is about 1.5, and accordingly the critical angle is about 42°.

In the conventional technique illustrated in FIG. 2, since the incident light beams undergo the irregular reflection on the light reflecting plane 85, reflection angles of the scattered light beams 81 are not fixed and equal. Accordingly, light beams which, out of the scattered light beams 81, enter a module light receiving plane 82 include light beams the incident angles of which are smaller than the critical angle. These light beams, in some cases, undergo no total internal reflection on the module light receiving plane 82, then passing through into the outside of the module light receiving plane 82. This phenomenon prevents enhancement of the light collection efficiency.

In this way, in the conventional technique illustrated in FIG. 2, it is intended to collect, into the photovoltaic elements 84, the incident light beams 81 incoming into the portion between the photovoltaic elements 84 with an intention of simply not wasting the incident light beams. No consideration, however, has been given to enhancement of the light collection efficiency. No consideration has been given to the concentration ratio, either.

It is an object of the present invention to provide a light concentrator photovoltaic module, in which a light receiving area of a photovoltaic element is comparatively small and which is capable of enhancing a light collection efficiency and/or a light concentration ratio, and a method of manufacturing the module, and a light concentrator photovoltaic system.

According to one aspect of the present invention, the light concentrator photovoltaic module includes a flat module light receiving plane upon which sunlight is incident, a plurality photovoltaic elements, a light reflecting member, and a medium for transmitting the sunlight to the photovoltaic elements and the light reflecting member, wherein the module light receiving plane is formed by a surface of the medium upon which the sunlight is incident, and the medium and the light reflecting member are joined with each other so that their interface forms a light reflecting plane;

wherein, with the module light receiving plane and the photovoltaic elements being located at a relatively upper level and at a relatively lower level, respectively, the light reflecting plane includes, between adjacent two photovoltaic elements, at least two first inclined planes and at least two second inclined planes, the first inclined planes being rightwardly ascending while the second inclined planes are leftwardly ascending, respectively, as viewed on a cross section taken on a line on which the adjacent two photovoltaic elements lie, at least two first inclined planes being arranged on a right side of a middle point of a distance between the adjacent two photovoltaic elements while at least two second inclined planes being arranged on a left side of the middle point; and wherein a portion of the light reflecting plane including the first and second inclined planes between the adjacent two photovoltaic elements is arranged relative to one of the two adjacent photovoltaic elements which is on a right side in such a manner that the one photovoltaic element has a light receiving plane at least partly positioned within a parallelogramic area, as viewed on the cross section, consisting of first to fourth sides, the first side defined by a first reflection light beam produced by a sunlight beam entering a left edge of a most leftwardly located one of the second inclined planes of the portion of the light reflecting plane, arriving at and undergoing total internal, reflection on the module light receiving plane, the second side defined by a second reflection light beam produced by the sunlight beam entering a most rightwardly located one of the second inclined planes of the portion of the light reflecting plane and arriving at and undergoing total internal reflection on the module light receiving plane without impinging on an opposed on of the first inclined planes, the third side defined by a line on which points of the total internal reflection of the first and second reflection light beams on the module light receiving plane lie, and the fourth side defined by a line farther from the module light receiving plane than a plane containing the uppermost portions of the first and second inclined plane containing the uppermost portions of the first and second inclined planes of the portion of the light receiving plane.

Referring to FIGS. 3A to 3D, the explanation will be given below concerning one aspect of the present invention. A groove-shaped light reflecting plane denoted by a reference numeral 5 is configured to ensure that at least two rightwardly inclined planes (inclined in the direction of line denoted by numeral 66 in FIG. 3D) are provided on the right side of central line 67 and that at least two leftwardly ascending inclined planes (inclined in the direction of line denoted by numeral 65 in FIG. 3D) are provided on the left side of the central line 67. In the drawings, a reference numeral 2 denotes a flat module light receiving plane, and numerals 4-1, 4-2 denote photovoltaic elements, and a numeral 3 denotes a medium occupying a space defined by the module light receiving plane, light reflecting plane and photovoltaic elements. The module light receiving plane 2 is formed by a surface of the medium 3. The groove-shaped light reflecting plane 5 is realized by an interface between a light reflecting member formed in a V-series structure joined with the V-series structure surface of the medium 3 opposite to the module light receiving plane 2. The light reflecting member, being not particularly shown, may be a layer of a metal. The described arrangement of the light reflecting member and the photovoltaic elements is for example only.

By this structure, it is possible to receive, in all the regions on the photovoltaic element in which directly incoming light beams are received, light beams incoming into the photovoltaic element after being reflected by the light reflecting plane, too. Applying this condition to the regions a, b in FIG. 1B results in a situation that not only the directly incoming light beams but also the light beams incoming after being reflected are received in the region a situated closer to the light reflecting plane 75. This situation makes it unnecessary to enlarge the light receiving area of the photovoltaic element up to the region b. Accordingly, for an equal light collection efficiency, it becomes possible to reduce the light receiving area of the photovoltaic element, i.e. the dimension thereof, more greatly than in the conventional techniques. This, eventually, allows the concentration ratio to be enhanced.

Incidentally, FIGS. 3A to 3D illustrating light concentrator photovoltaic module and cross sectional diagrams explained hereinafter are cross sectional views seen in a plane that traverses the module light receiving plane and transverse to the adjacent two photovoltaic elements and the light reflecting plane located therebetween.

The illustrative explanation will be given below concerning the following cases: A photovoltaic module in the case of FIG. 4A where each light reflecting plane includes three or more of inclined planes and a photovoltaic module in the case of FIG. 4B where each light reflecting plane includes two inclined planes. As is obvious from the drawings, in both of the cases, the following is possible: A light beam 1-1, which has entered a left edge of a leftwardly ascending inclined plane positioned the most leftwardly of a light reflecting plane 5-1, is caused to enter a left edge of the photovoltaic element 4-2 after undergoing total internal reflection on the module light receiving plane 2 (illustrated in a broken line after the total internal reflection). Also, the following is possible: A reflection light beam of a light beam 1-2, which has entered a leftwardly ascending inclined plane positioned the most rightwardly of the light reflecting plane 5-1, is caused to reach the module light receiving plane 2 without colliding with a rightwardly ascending inclined plane opposed to the leftwardly ascending inclined plane, and is then caused to enter a right edge of the photovoltaic element 4-2 after undergoing total internal reflection on the module light receiving plane 2 (illustrated in a broken line after the total internal reflection). In this way, the light beams reflected on the light reflecting plane 5 can be concentrated onto the entire surface of the photovoltaic element 4-2. Namely, there exists no region in which only the directly incoming light beams are received. Accordingly, it becomes possible to enhance the concentration ratio more greatly than in the conventional techniques with the light collection efficiency being maintained at a high level.

Also, it is not necessarily essential that, as is illustrated in the drawings, light receiving planes of the photovoltaic elements 4-1 and 4-2 are located on the same plane as a vertual plane 54 containing vertexes of the light reflecting planes 5-1 and 5-2.

The similar effects can be obtained by positioning at least a portion of a main light receiving plane of the photovoltaic element within a parallelogramic area 72 defined hereinafter. The main light receiving plane means light receiving planes situated on the front, the back and the side surfaces of the photovoltaic element. In this case, in order to make the light collection efficiency 90% or larger, it is required that the main light receiving plane occupy at least 90% of the parallelogramic area 72. The parallelogramic area 72 is formed by the following four sides: a first side defined by an incident light beam upon the left edge of the photovoltaic element 4-2, as shown by a broken line, produced by total internal reflection, on the module light receiving plane 2, of a light beam 1-1, which has entered the left edge of the leftwardly ascending inclined plane positioned the most leftwardly of the light reflecting plane 5-1, a second side defined by an incident light beam upon the right edge of the photovoltaic element 4-2, as shown by another broken line, produced by total internal reflection, on the module light receiving plane 2, of a light beam produced from a light beam 1-2, which has entered the leftwardly ascending inclined plane positioned the most rightwardly of the light reflecting plane 5-1 and reached the module light receiving plane 2 without colliding with the rightwardly ascending inclined plane opposed to the leftwardly ascending inclined plane, a third side defined by another broken line obtained by connecting points of the total internal reflections on the module light receiving plane 2 of these reflection light beams, and the remaining fourth side defined by another broken line (i.e., a side that is farther away from the module light receiving plane 2) positioned under the vertex plane 54 (i.e., a plane containing the uppermost portions of the respective inclined planes constituting the light reflecting plane 5-1, the uppermost portions being the nearest to the module light receiving plane 2, hereinafter, the same as above) of the light reflecting plane 5.

Also, it is possible to accomplish the object of the present invention regardless of whether or not the incident light beams 1-1, 1-2 enter the module light receiving plane 2 at an angle perpendicular thereto.

Also, the larger the number of the inclined planes constituting the groove-shaped light reflecting plane 5-1 becomes, the more greatly the thickness of the inclined planes (a distance between a virtual plane containing upper vertexes of grooves of the groove-shaped light reflecting plane and another virtual plane containing lower vertexes of the grooves of the groove-shaped light reflecting plane) can be decreased, and accordingly the easier it becomes to fabricate the light reflecting plane 5.

DETAILED DESCRIPTION OF THE PREFERRED EMBODIMENTS

Figure 4A:
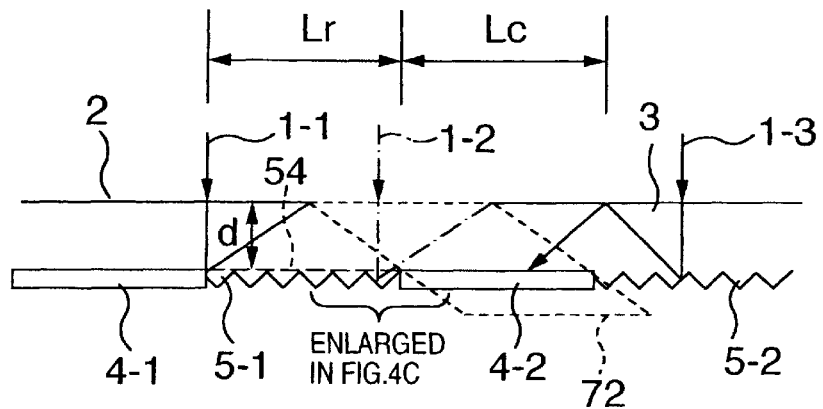
FIGS. 4A to 4C are cross sectional views of the light concentrator photovoltaic module according to another embodiment of the present invention.

The explanation will be given below concerning an embodiment of the present invention, including the respective configuration components and the dimension therebetween. As described earlier, the drawings FIGS. 4A to 4C and others are the cross sectional views seen on the plane that traverses the module light receiving plane and are transverse to the adjacent two photovoltaic elements and the light reflecting member located therebetween. First, the explanation will be given regarding Lr, i.e., length of the light reflecting plane, and Lc, i.e., length of the photovoltaic element. Referring to FIG. 4C, in which a portion of the structure in FIG. 4A is enlarged, it will be seen that the following formulae (3), (4) hold. Here, the reference notations therein are defined as follows: θin is an incident angle 6 of an incident light beam 1 toward the module light-receiving plane 2, and θ1 is a refraction angle 7 into the medium 3, and θ3 is an angle 8 that an inclined plane 5S in the groove-shaped light reflecting plane 5-1 forms with the module light receiving plane 2, and θ4 is an angle 9 that a reflection light beam from the inclined plane 5S forms with the module light receiving plane 2 when it enters the module light receiving plane 2 from the side of the medium 3.

$$\theta 1 = \arcsin(\sin(\theta in)/n) \quad (3)$$

$$\theta 4 = 90° + \theta 1 - (2 \times \theta 3) \quad (4)$$

Here, a reference notation n denotes a refractive index of the medium 3.

Figure 4B:
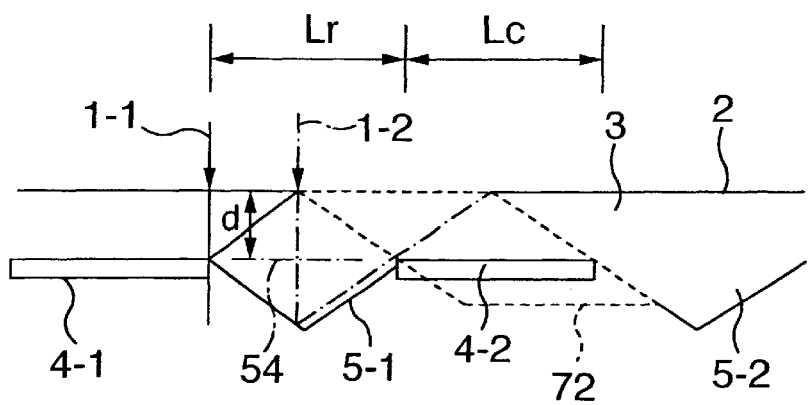
Figure 4C:
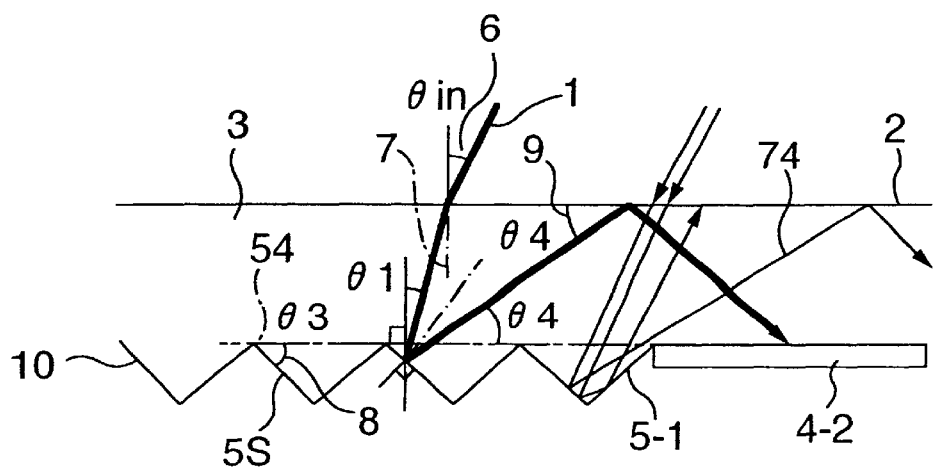

Usually, the photovoltaic module is set such that, as is illustrated in FIGS. 4A, 4B, the solar light beams will enter the module light receiving plane 2 at substantially right angles. Here, it is assumed that a reference notation d denotes a distance between a virtual plane containing vertexes of the light reflecting planes 5-1, 5-2 and the module light-receiving plane 2, Lr denotes the length of the light reflecting planes 5-1, 5-2, and Lc denotes the length of the photovoltaic elements 4-1, 4-2. Then, making reference to FIG. 4C finds out that the following relation (5) holds among these reference notations.

$$\tan(\theta 4) = d/(Lr/2) = d/(Lc/2) \quad (5)$$

Using this relation and the formula (4) and letting θin=θ1=0°, the following formula (6) is determined.

$$Lr = Lc = (2 \times d)/\tan(\theta 4) = (2 \times d)/\tan(90° - 2 \times \theta 3) \quad (6)$$

When, in this way, Lr and Lc are made equal to each other in length, the concentration ratio becomes equal to 2, and it is possible to collect, into the photovoltaic elements 4-1, 4-2, all of the light beams that enter the module light receiving plane 2 at right angles. Namely, it becomes possible to fabricate a light concentrator photovoltaic module the light collection efficiency of which is equal to 100% for the light beams that enter the module light receiving plane at right angles.

Also, with this arrangement employed as a fundamental reference arrangement, Lr, the length of the light reflecting plane, and Lc, the length of the photovoltaic element, may be varied, thereby making it possible to change the concentration ratio. At this time, in the case where, for example, Lr, the length of the light reflecting planes, is made shorter and Lc, the length of the photovoltaic element, is made longer and a sum of Lr and Lc is maintained at a value 2 times as great as the value in the formula (6), the light collection efficiency for the light beams entering the module light receiving plane at right angles remains at 100% although the concentration ratio may be decreased. Conversely, in the case where, for example, Lr, the length of the light reflecting plane, is made longer and Lc, the length of the photovoltaic element, is made shorter and the sum of Lr and Lc is maintained at the value 2 times as great as the value in the formula (6), the concentration ratio is enhanced. However, a portion of the light beams entering the module light receiving plane at right angles cannot be collected into the photovoltaic elements, and thus the light collection efficiency becomes smaller than 100%.

As described above, making Lr larger and making Lc smaller brings about a decrease in the light collection efficiency. The relation between the value of Lr and the light collection efficiency is as follows: When Lr is smaller than a value that is 1.1 times the above-described calculation value given by the formula (6), the decrease in the light collection efficiency will be less than 5%, and when Lr is smaller than a value that is 1.2 times the above-described value, the decrease in the light collection efficiency will be less than 10%. If, however, Lr exceeds this, the light collection efficiency will be decreased very rapidly. Consequently, it is required to make Lr smaller than 1.2 times the above-described value or, preferably, smaller than 1.1 times the above-described value.

Also, when Lc is reduced up to a value that is 0.9 times the above-described calculation value given by the formula (6), the decrease in the light collection efficiency will be less than 5%, and when Lc is reduced up to a value that is 0.75 times the above-described value, the decrease in the light collection efficiency will be less than 10%. Consequently, it is required to make Lc larger than 0.75 times the above-described value or, preferably, larger than 0.9 times the above-described value. Incidentally, as explained later using FIG. 13, a decrease in the concentration ratio results in a decrease in the cost-reducing effect. Accordingly, in order to make the cost for the conventional module 90% or smaller, it is preferable that Lc should be smaller than 3 times the above-described value.

Next, the explanation will be given below concerning the case where the light receiving plane in the photovoltaic module is not set at right angles with respect to the main solar light beams. In this case, the incident light beams 1-1, 1-2 enter the module light receiving plane 2 with an incident angle θ in (FIG. 4C). At this time, Lr, Lc are represented by the following formulae (7), (8).

$$Lr = Lc = (2 \times d)/\tan(\theta 4) = (2 \times d)/\tan(90° - (2 \times \theta 3 - \theta 1)) \quad (7)$$

$$\theta 1 = \arcsin(\sin(\theta in)/n) \quad (8)$$

Here, the reference notation n denotes the refractive index of the medium 3.

In this case, too, Lr is made smaller than 1.2 times the above-described calculation value given by the formula (7) or, preferably, smaller than 1.1 times the above-described value, and Lc is made larger than 0.75 times the above-described calculation value or, preferably, larger than 0.9 times the above-described value. This also makes it possible to suppress the decrease in the light collection efficiency. Also, in order to maintain the cost-reducing effect, it is preferable that Lc should be smaller than 3 times the above-described calculation value.

Next, referring to FIGS. 5A to 5D, the explanation will be given below concerning the case where double-sided light receiving photovoltaic elements are employed as photovoltaic elements in the photovoltaic module. In this case, too, a light receiving plane of each of plate-like photovoltaic elements 4-1a, 4-2a is positioned within the above-described parallelogramic area 72, thereby making it also possible to obtain the photovoltaic module with a high light collection efficiency. In addition to this, here, the light receiving plane of each of the photovoltaic elements 4-1a, 4-2a is positioned within a trapezoidal area 73 illustrated in FIG. 5A. This allows the concentration ratio to be enhanced even further.

Figure 5A:
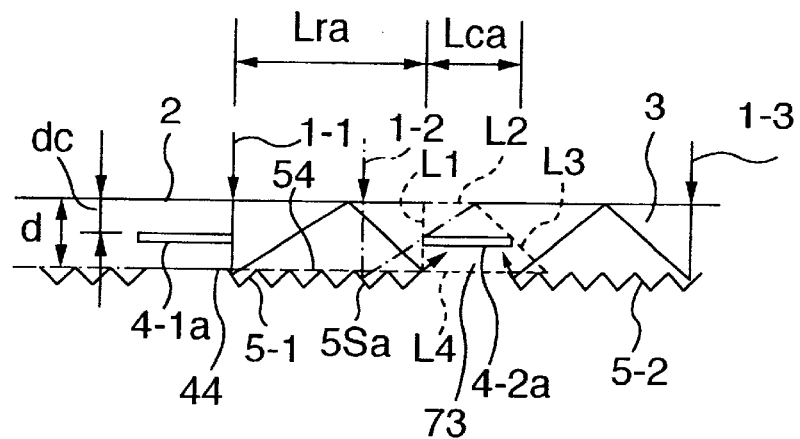
FIGS. 5A to 5D are cross sectional views of the light concentrator photovoltaic module according to another embodiment of the present invention.

A detailed explanation will be given hereinafter. FIG. 5A illustrates the above-described cross sectional plane of a photovoltaic module. In each of the photovoltaic elements 4-1a, 4-2a, the both surfaces (i.e., two primary surfaces opposed to each other), which are on a module light receiving plane said and on the back side opposite thereto, function as element light receiving planes. Moreover, the photovoltaic module is configured in such a manner that the photovoltaic elements 4-1a, 4-2a are embedded into the medium 3. A light reflecting plane 44 is formed on the other primary surface of the medium 3 that is situated under the photovoltaic elements 4-1a, 4-2a. This configuration permits light beams reflected on the light reflecting planes 5 to be received on the back surfaces of the photovoltaic elements 4-1a, 4-2a as well. Accordingly, it becomes possible to use photovoltaic elements 4-1a, 4-2a of a smaller dimension without lowering the light collection efficiency.

The photovoltaic elements 4-1a, 4-2a are located in the following manner: Namely, it is referable that at least a portion of the light receiving lane of each of the photovoltaic elements 4-1a, 4-2a should be positioned within the trapezoidal area 73 formed by the following four sides: a first side defined by a broken line L1 perpendicular to the module light receiving plane 2 and passing through a point at which a reflection light beam of a light beam 1-1 entering a left edge of a leftwardly ascending inclined plane positioned the most leftwardly of the groove-shaped light reflecting plane 5-1 and undergoing total internal reflection on the module light receiving plane 2 intersects a vertual plane 54 containing vertexes of the groove-shaped light reflecting plane 5-1; a second side defined by a broken line L3 illustrating an optical path of a reflection light beam of a light beam 1-2 entering a leftwardly ascending inclined plane, reaching the module light receiving plane 2 without colliding with a rightwardly ascending inclined plane opposed to the leftwardly ascending inclined plane and undergoing total internal reflection on the plane 2, the leftwardly ascending inclined plane being positioned most rightwardly among leftwardly ascending inclined planes of the light reflecting plane 5-1 the reflection light beams from which do not collide with the photovoltaic element 4-2a; a third side defined by a broken line L2 obtained by connecting points of intersection of these broken lines with the module light receiving plane 2; and the remaining fourth side defined by a broken line L4 positioned nearer to the module light receiving plane 2 than the virtual plane 54 containing vertexes of the groove-shaped light reflecting planes 5-1, 5-2.

In this case, too, in order to keep the light collection efficiency 90% or larger, it is required that the light receiving plane occupy at least 90% of the trapezoidal area 73.

Next, the explanation will be given below concerning the embodiment in FIG. 5A, including the respective configuration components and the dimension therebetween. Usually, the photovoltaic module is set so that, as is illustrated in FIG. 5A, the solar light beams will enter the module light receiving plane 2 at right angles. Here, it is assumed that a reference notation dc denotes a distance between the upper light receiving plane each of the photovoltaic elements 4-1a, 4-2a and the module light-receiving plane 2, and d denotes a distance between the virtual plane 54 containing vertexes of the groove-shaped light reflecting planes 5-1, 5-2 and the module light receiving plane 2, and Lra denotes a length of the groove-shaped light reflecting planes 5-1, 5-2, and Lca denotes a length of the photovoltaic elements 4-1a, 4-2a, (Here, these lengths are seen and measured in a direction of a line on which the two adjacent photovoltaic elements exist in the illustrated cross sectional plane.), and θ3 denotes an angle 8 formed by an inclined plane 5Sa in the light reflecting planes 5-1, 5-2 and the module light receiving plane 2. Then, under the condition that θ in (the incident angle of the solar light beam toward the module light-receiving plane 2)=θ1 (the refraction angle into the medium 3)=0°, making reference to FIGS. 4a, 4c finds out that the following relations (9), (10) hold among these reference notations.

$$Lra=(2 \times d)/\mathrm{Tan}(90°-2 \times \theta 3) \quad (9)$$

$$Lca=(2 \times dc)/\mathrm{Tan}(90°-2 \times \theta 3) \quad (10)$$

These make it possible to fabricate a light concentrator photovoltaic module the light collection efficiency of which is equal to 100% for the light beams that enter the module light receiving plane 2 at right angles.

Also, with this arrangement employed as a fundamental reference arrangement, Lra, the length of the light reflecting planes, and Lca, the length of the photovoltaic elements, may be varied, thereby making it possible to change the concentration ratio. At this time, in the case where, for example, Lra, the length of the light reflecting planes, is made shorter and Lca, the length of the photovoltaic elements, is made longer and a sum of Lca and Lra is maintained at a sum of the values given by the formulae (9), (10), the light collection efficiency for the light beams entering the module light-receiving plane at right angles remains at 100%, although the concentration ratio may be decreased. Conversely, in the case where, for example, Lra, the length of the light reflecting planes, is made longer and Lca, the length of the photovoltaic elements, is made shorter and a sum of Lca and Lra is maintained at the sum of the values given by the formulae (9), (10), the concentration ratio will be enhanced. However, a portion of the light beams entering the module light receiving plane at right angles cannot be collected into the photovoltaic elements, and thus the light collection efficiency becomes smaller than 100%.

As described above, making Lra equal to or larger than the above-mentioned value brings about a decrease in the light collection efficiency. The relation between the value of Lra and the light collection efficiency is as follows: When Lra is smaller than a value that is 1.1 times the above-described value given by the formula (9), the decrease in the light collection efficiency will be less than 5%, and when Lra is smaller than a value that is 1.2 times the above-described value, the decrease in the light collection efficiency will be less than 10%. If, however, Lra exceeds this, the light collection efficiency will be decreased very rapidly. Consequently, it is required to make Lra smaller than 1.2 times the above-described value or, preferably, smaller than 1.1 times the above-described value. Also, when Lca is reduced up to a value that is 0.9 times the above-described value given by the formula (10), the decrease in the light collection efficiency will be less than 5%, and when Lca is reduced up to a value that is 0.75 times the above-described value, the decrease in the light collection efficiency will be less than 10%. Consequently, it is required to make Lca larger than 0.75 times the above-described value or, preferably, larger than 0.9 times the above-described value. Incidentally, the decrease in the concentration ratio results in the decrease in the cost-reducing effect. Accordingly, it is preferable that Lca should be smaller than 3 times the above-described value.

Next, the explanation will be given below concerning the case where the photovoltaic module is not set at right angles toward the main solar light beams. In this case, the incident light beams 1-1, 1-2 enter the module light receiving plane 2 with an incident angle θ in. At this time, the following formulae (11), (12) and (13) represent Lra, Lca.

$$Lra = (2 \times d)/\mathrm{Tan}(90° - (2 \times \theta 3 - \theta 1)) \quad (11)$$

$$Lca = (2 \times dc)/\mathrm{Tan}(90° - (2 \times \theta 3 - \theta 1)) \quad (12)$$

$$\theta 1 = \mathrm{arc}\ \mathrm{Sin}(\mathrm{Sin}(\theta\mathrm{in})/n) \quad (13)$$

In this case, too, Lra should be made smaller than 1.2 times the above-described value given by the formula (11) or, preferably, smaller than 1.1 times the above-described value, and Lrc should be made larger than 0.75 times the above-described value given by the formula (12) or, preferably, larger than 0.9 times the above-described value to suppress the decrease in the light collection efficiency. Also, in order to maintain the cost-reducing effect, it is preferable that Lrc should be smaller than 3 times the above-described value.

Figure 5B:
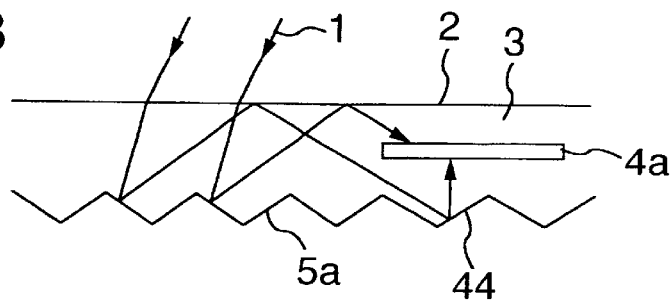
Figure 5C:
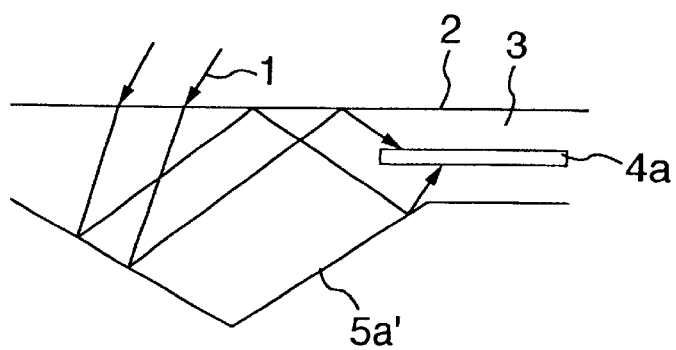

Meanwhile, in a structure illustrated in FIG. 5B, a light reflecting plane includes a continuous groove-shaped light reflecting plane 44 on the other primary surface of a medium 3 so that reflection light beams therefrom can enter the back surface of a photovoltaic element 4a as well. Namely, the groove-shaped light reflecting plane 5a has inclined planes 44 that are provided under the photovoltaic element 4a as well. Light beams entering the portions can be reflected in the direction of the photovoltaic element 4, which makes it possible to enhance the light collection efficiency. Also, the similar effect can also be obtained if, as illustrated in FIG. 5C, a light reflecting plane 5a' includes a pair of inclined planes as a modification of the embodiment in FIG. 5A.

Figure 5D:
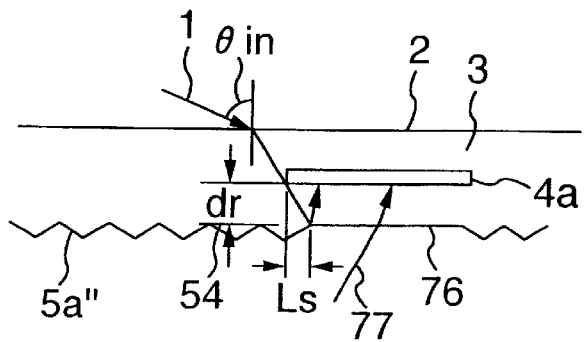

Also, as illustrated in FIG. 5D, instead of forming the light reflecting inclined planes 44 on the other primary surface of the medium 3 situated under the photovoltaic element 4a, a light transmitting plane 76 may be formed. This makes it possible to collect, into the photovoltaic element 4a, light beams incoming from the other primary surface of the medium 3 or light beams 77 incoming out of the back surface of the module. In this case, in order to effectively collect the incident light beams 1, which have entered from a front surface 2 of the module, into the back surface of the photovoltaic element 4a, Ls, a distance between a left edge of the photovoltaic element 4a and a right edge of a groove-shaped light reflecting plane 5a", should be given by the following formula (14). At this time, the reference notations therein are assumed as follows: θin is an incident angle of an incident light beam that has the largest incident angle among the incident light beams 1, and dr is a distance between the back surface of the photovoltaic element 4a and a virtual plane 54 containing vertexes of the groove-shaped light reflecting plane, and n is a refractive index of the medium 3.

$$Ls = dr \times \mathrm{Tan}(\mathrm{arc}\ \mathrm{Sin}(\mathrm{Sin}(\theta\mathrm{in}) \div n)) \quad (14)$$

In this way, it becomes possible to collect, into the solar photovoltaic element 4a, all of the light beams that have entered from the front surface 2 of the module and, after being reflected on the groove-shaped light reflecting plane 5a" enter the back surface of the photovoltaic element 4a.

The relation between the value of Ls and the light collection efficiency is as follows: When Ls is larger than 0.9 times the above-described calculation value given by the formula (14), the decrease in the light collection efficiency will be less than 5%, and when Ls is larger than 0.8 times the above-described value, the decrease will be less than 10%. If, however, Ls is smaller than this, the light collection efficiency will be decreased very rapidly. Consequently, it is required to make Ls larger than 0.8 times the above-described value or, preferably, larger than 0.9 times the above-described value.

Figure 6A:
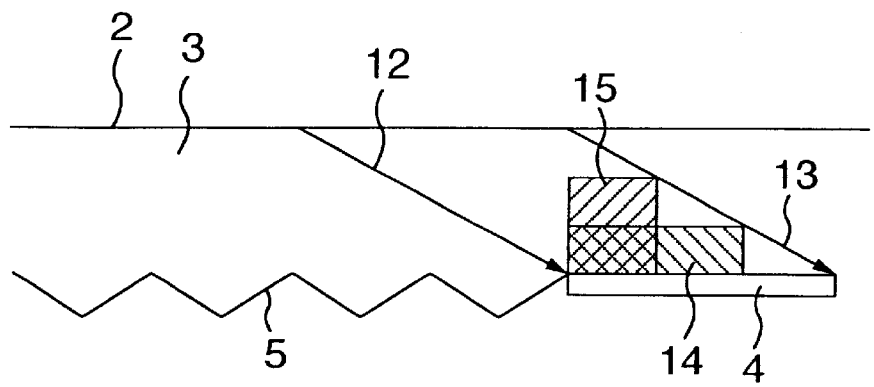
FIGS. 6A and 6B are cross sectional views of the light concentrator photovoltaic module according to another embodiment of the present invention.

Next, referring to FIGS. 6A, 6B, the explanation will be given below concerning a structure where, using a photovoltaic element that has light receiving planes on the side surfaces thereof as well, light receiving planes of the photovoltaic element are positioned within the medium. These drawings also illustrate the above-described cross sectional plane of the photovoltaic module. In this case, too, the light receiving planes of the photovoltaic element are positioned within the parallelogramic area 72 explained with reference to FIGS. 4A, 4B, thereby making it possible to obtain the solar photovoltaic module with a high light collection efficiency. In addition to this, as illustrated in FIG. 6A, length of the photovoltaic element is made shorter, thereby allowing the light collection efficiency to be enhanced even further. In this embodiment, instead of using the plate-shaped photovoltaic element 4 in which only the upper surface thereof is the element light receiving plane, a thick plate-shaped photovoltaic element 14 or a cube-shaped photovoltaic element 15 in which the upper surface thereof and the side surfaces thereof are the element light receiving planes. At this time, a light beam 12 and a light beam 13, which, after undergoing total reflection on the module light-receiving plane 2, respectively enter a left edge and a right edge of the photovoltaic element 4 in which only the upper surface thereof is the element light receiving plane, can be collected using the thick plate-shaped photovoltaic element 14 or the cube-shaped solar photovoltaic element 15 of narrower width. In this way, in the case where the element light receiving planes are so configured as to be embedded into the medium, as compared with the case of using the photovoltaic element 4 in which only the upper surface is the element light receiving plane, even the photovoltaic elements of narrower width are capable of obtaining a substantially equal light collection efficiency.

Figure 6B:
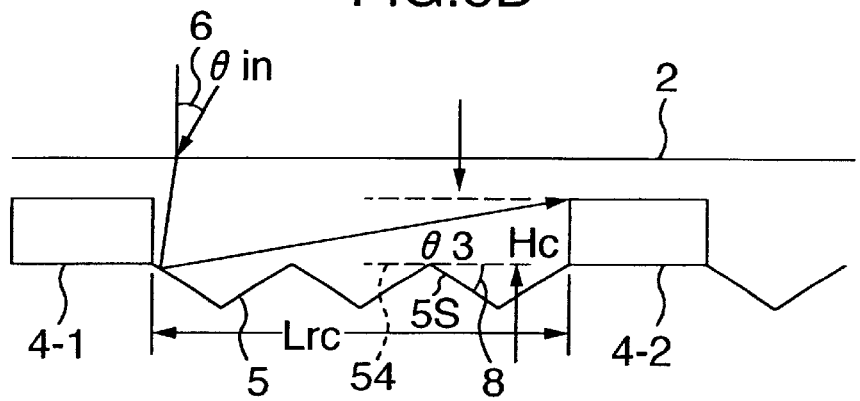

In order to enhance the concentration ratio in these structures, Lrc, length of the light reflecting plane 5, is represented by the following formulae (15), (16). At this time, the reference notations therein are defined as follows:

As illustrated in FIG. 6B, Hc is a distance between a portion of the photovoltaic element 4-2 that is the nearest to the module light receiving plane 2 and the vertex plane 54 of the groove-shaped light reflecting plane 5, and θin is the incident angle of the incident light beam 1 toward the module light receiving plane 2, and θ3 is the angle 8 formed by the inclined plane 5S in the light reflecting plane 5 and the module light receiving plane 2.

$$Lrc=Hc/\text{Tan}(90°-(2\times\theta 3-\theta 1)) \quad (15)$$

$$\theta 1=\text{arc Sin}(\text{Sin}(\theta in)/n) \quad (16)$$

It is now possible to receive all of the light beams reflected on the light reflecting plane 5 on the side surfaces of the photovoltaic element 4-2. This permits the light collection efficiency to become equal to 100%.

When Lrc is smaller than 1.2 times the above-described value given by the formula (15), the decrease in the light collection efficiency will be less than 5%, and when Lrc is smaller than 1.4 times the above-described value, the decrease will be less than 10%. If, however, Lrc exceeds this, the light collection efficiency will be decreased very rapidly. Consequently, it is required to make Lrc smaller than 1.4 times the above-described value or, preferably, smaller than 1.2 times the above-described value.

Also, in general, the light concentrator photovoltaic module is set so that the solar light beams will enter the module light-receiving plane 2 at right angles. In this case, θin, i.e., the incident angle of the solar light beams, is equal to 0°. Then, under the condition that θin=θ1=0°, the formula (15) is reduced to the following formula (17).

$$Lrc=Hc/\text{Tan}(90°-(2\times\theta 3)) \quad (17)$$

In this case, too, Lrc is made smaller than 1.4 times the above-described value given by the formula (17) or, preferably, smaller than 1.2 times the above-described value, thereby allowing the concentration ratio to be enhanced.

Also, if a configuration of the cross sectional plane of the photovoltaic element is a rounded rectangle or a shape close to an ellipse, a rectangle, which is situated within the cross sectional plane of the photovoltaic element and has the largest area and the one side of which is parallel to the module light-receiving plane, is used as an approximation of the configuration of the photovoltaic element, thereby making it possible to set the lengths of the light reflecting plane and the photovoltaic element in accordance with the above-mentioned calculation formulae.

The refractive index n explained up to now is determined uniquely when the medium 3 is composed of a single material. Meanwhile, if the medium is composed of parts of a plurality of different materials, a value obtained by averaging the respective refractive indexes with a ratio among volumes occupied by the respective materials is employed as the refractive index n. Also, when the medium 3 is basically composed of a single medium and, in order to cause this to adhere to the light reflecting member, an adhesive layer the thickness of which is 10% or less of that of the medium is used, it is negligible that the adhesive layer functions as a second medium. In this case, accordingly, only a refractive index of the main medium can be employed as the refractive index n.

When a light beam reflected on a inclined plane in the groove-shaped light reflecting plane enters an inclined plane opposed to the inclined plane and having a different inclination, and then the light beam reflected on the opposed inclined plane enters the module light-receiving plane 2, the incident angle will become smaller and there occurs no total internal reflection, and thus the light beam leaks away into the outside of the photovoltaic module. In order to prevent this phenomenon, it is desirable to employ 120° as an angle that the pair of opposing inclined planes form toward the module light-receiving plane 2. Also, if this angle falls in the range of 120°±10°, a decrease in the light collection efficiency which is caused by the fact that the light beam reflected on the light reflecting plane enters the opposing inclined plane, will be less than 5%, If, however, the angle exceeds this, the light collection efficiency will be decreased very rapidly. Consequently, it is desirable to set the above-described angle to be 120°±10°.

Figure 7:
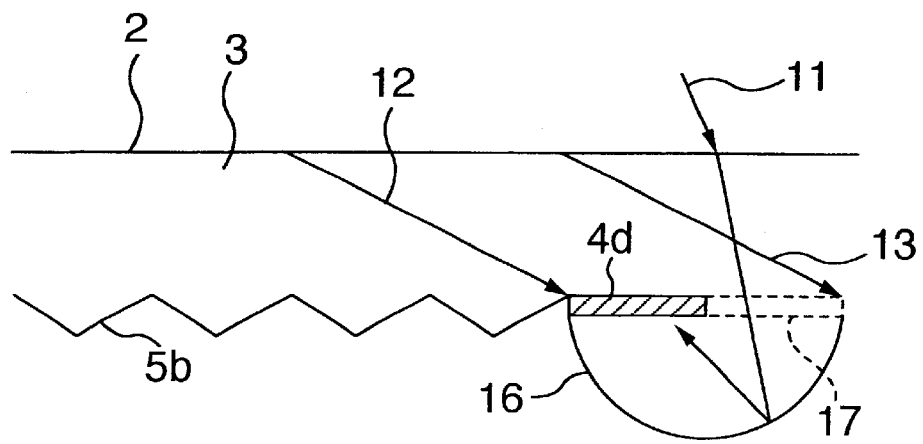
FIG. 7 is a cross sectional view of the light concentrator photovoltaic module according to another embodiment of the present invention.

Next, referring to FIG. 7, which illustrates the above-described cross sectional plane of the photovoltaic module, the explanation will be given below concerning a structure that makes it possible to reduce an area of the photovoltaic element. In this structure, so as to reduce the area of the photovoltaic element, a photovoltaic element 4d is used that is obtained by eliminating, for example, a right-hand side portion 17 of the photovoltaic element that has the two primary surfaces each functioning as the element light receiving planes. A light beam 11 that has entered the right-hand side portion 17 is collected into the back surface of the photovoltaic element 4d by a circular arc-shaped light reflecting plane 16 installed at the back side of the photovoltaic element 4d. In this way, by using the double-sided light receiving photovoltaic element 4d, a groove-shaped light reflecting plane 5b and the circular arc-shaped light reflecting plane 16, it becomes possible to enhance the concentration ratio up to a value that is two times as large as that in the structure without the circular arc-shaped light reflecting plane. Ideally, a configuration of the circular arc-shaped light reflecting plane 16 is a portion of a perfect circle. However, since an incident angle of the incident light beam into the right-hand side portion 17 is not distributed in the range of ±90°, almost the same effect can be obtained even if the configuration of the light reflecting plane 16 is shifted from the perfect circle. Accordingly, when fabricating this configuration, considering restrictions such as an accuracy needed for the fabrication and so on, such configurations are allowable as a parabola or a configuration including a portion of an ellipse obtained by pulling and extending the circular arc-shaped light reflecting plane. Also, a configuration such as a polygon used as approximations of these configurations substantially exerts the effect similar to the circular arc-shaped light reflecting plane. In this structure, a sum of length of the photovoltaic element 4d and that of the right-hand side portion 17 is equivalent to Lc, the length of the photovoltaic elements 4-1, 4-2 in FIG. 4A. Consequently, the sum of the length of the photovoltaic element 4d and that of the right-hand side portion 17 is made equal to Lc indicated in FIG. 4A, thereby permitting a high light collection efficiency to be obtained. Also, the length of the photovoltaic element 4d is made longer than that of the right-hand side portion 17, thereby making it possible to reduce a loss in the light collection efficiency due to such causes as a fabrication error of the circular arc-shaped light reflecting plane 16.

Figure 8:
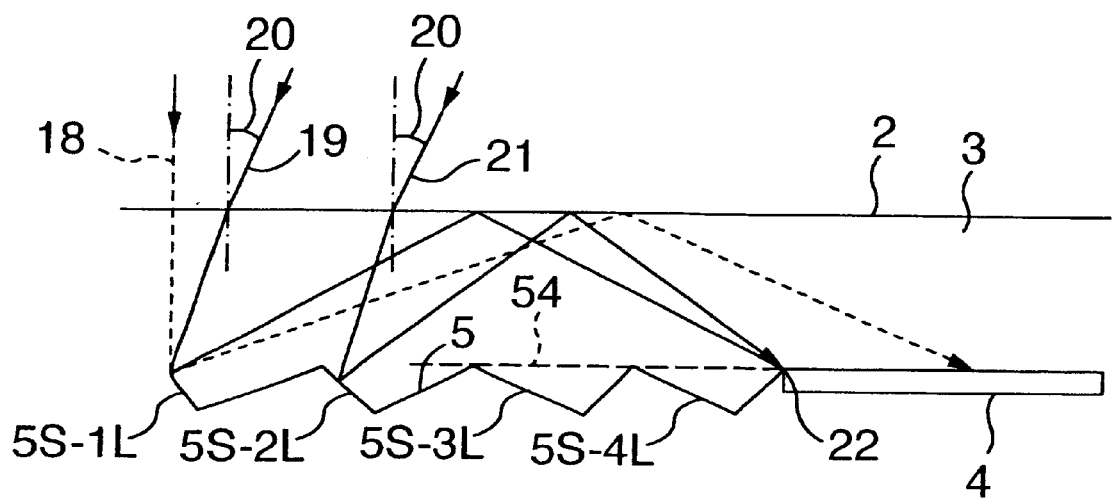
FIG. 8 is a cross sectional view of the light concentrator photovoltaic module according to another embodiment of the present invention.
Figure 9:
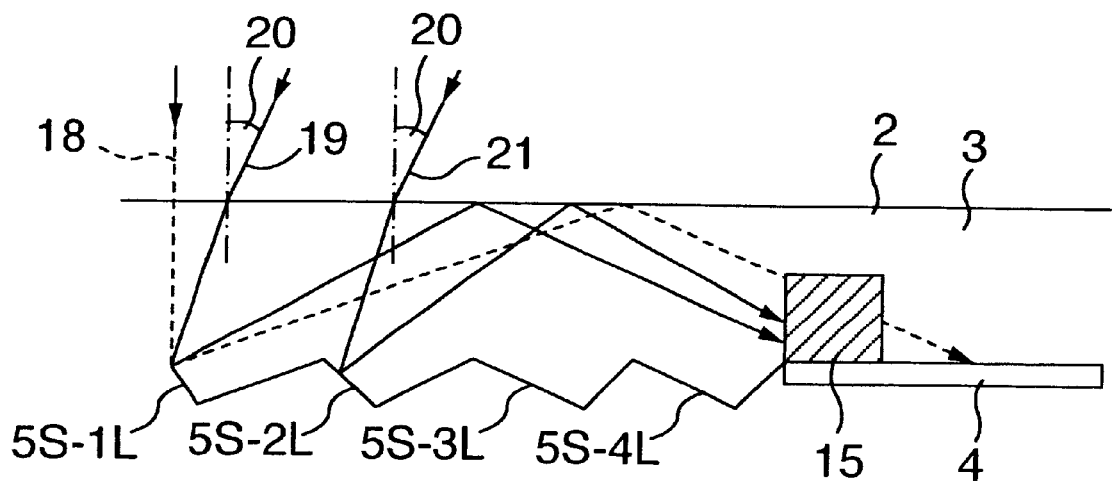
FIG. 9 is a cross sectional view of the light concentrator photovoltaic module according to another embodiment of the present invention.

Next, referring to FIG. 8, which illustrates the above-described cross sectional plane of the photovoltaic module, the explanation will be given below concerning a structure that makes it possible to enhance the light collection efficiency even further. The explanation has been mainly given concerning the light beams entering the module light receiving plane at right angles. It will be seen that a point 22 at which a light beam 19 or a light beam 21 entering the module light receiving plane 2, for example, with an incident angle 20, after being reflected to the right by leftwardly ascending inclined planes 5S-1L to 5S-4L in a groove-shaped light reflecting plane 5 and undergoing total internal reflection on the module light-receiving plane 2 intersects a virtual plane 54 containing vertexes of the inclined planes in the light reflecting plane 5 is on the left-hand side of a point at which a light beam 18 entering the module light receiving plane 2 at right angles, after, similarly, being reflected by the inclined plane and undergoing total Internal reflection on the module light-receiving plane intersects the virtual plane 54 containing vertexes of the inclined planes in the light reflecting plane. Consequently, in order to cause these light beams 19, 21 to enter the photovoltaic element 4, It Is necessary to make inclinations of the leftwardly ascending Inclined planes 5S-1L, 5S-2L larger than the inclinations designed and set in correspondence with the light beam 18 entering the module light receiving plane 2 at right angles. In contrast to this, it is unnecessary to make inclinations of the leftwardly ascending inclined planes 5S-3L, 5S-4L so large. In this way, an inclination of a leftwardly ascending inclined plane situated relatively more leftwardly is made larger, thereby making it possible to collect the light beams more effectively. In the above-described case where the inclinations are varied depending on the positions of the inclined planes, the inclination angles of the leftwardly ascending inclined planes 5S-IL, 5S-2L are set such that, for example, the light beams 19, 21, which are the most rightwardly inclined among the light beams to be collected, are each reflected on left edges of the leftwardly ascending inclined planes 5S-1L, 5S-2L and then enter the left edge 22 of the light receiving plane of the photovoltaic element 4. This permits the light collection efficiency to be enhanced even further. Also, as illustrated in FIG. 9, in the case of using the cube-shaped photovoltaic element 15 having the element light receiving planes on the side surfaces as well, the inclinations of the leftwardly ascending inclined planes 5S-1L, 5S-2L and so on, which are situated relatively more leftwardly are also made larger. Namely, the inclinations of the respective leftwardly ascending inclined planes 5S-1L, 5S-2L and so on are set to be larger so that, for example, the light beams 19, which are the most rightwardly inclined among the light beams to be collected into a light receiving plane on the left side surface of the cube-shaped photovoltaic element 15, enter the light receiving plane of the cube-shaped photovoltaic element 15. This also permits the light collection efficiency to be enhanced even further.

In the above explanations regarding the optical paths and so on, use is made of enlarged diagrams of the photovoltaic module including a light reflecting plane provided on the left side and a photovoltaic element provided on the right side cooperating with each other. It is needless to say, however, that the similar explanations are also applicable to a case where light beams reflected on rightwardly ascending inclined planes in the light reflecting plane enter the photovoltaic element installed on the left side.

Figure 10A:
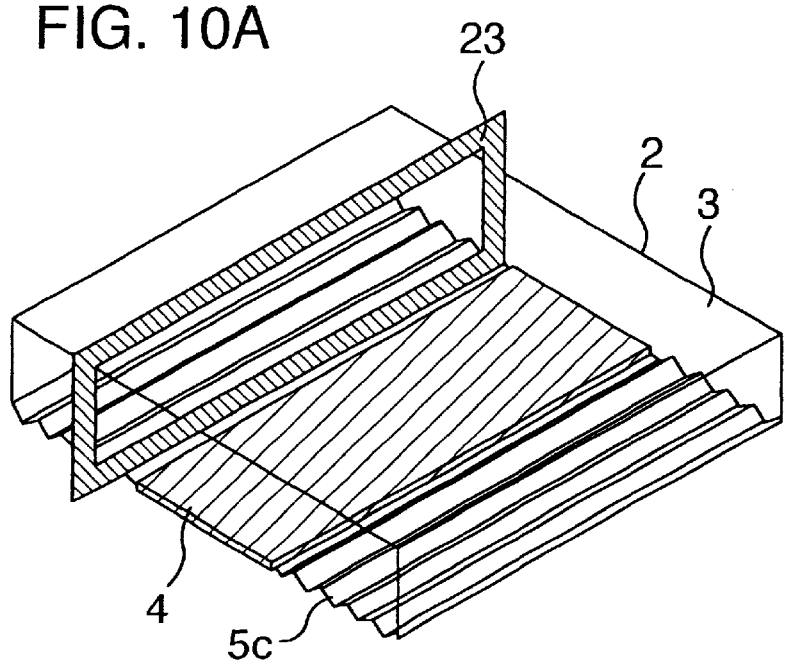
FIGS. 10A and 10B are cross sectional views of the light concentrator photovoltaic module according to another embodiment of the present invention.
Figure 10B:
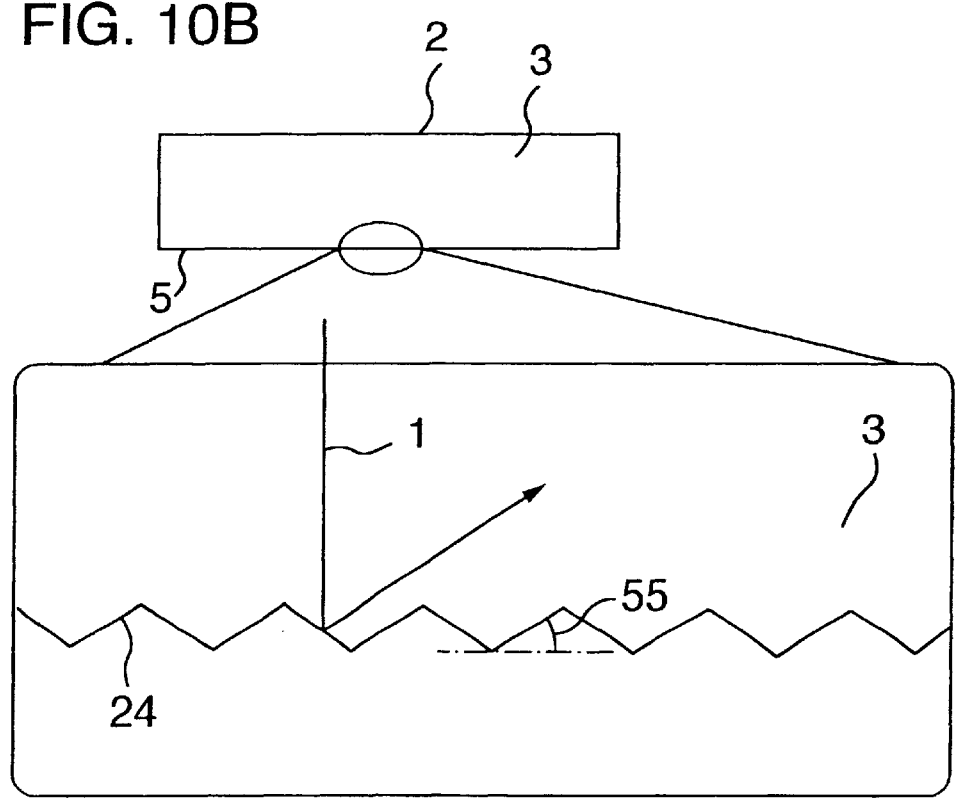

Next, referring to FIGS. 10A, 10B, the explanation will be given below concerning a structure that makes it possible to enhance the light collection efficiency. The structure is as follows: A groove-shaped light reflecting plane 5c as illustrated in FIG. 10A includes second grooves 24 in a cross sectional plane 23 that is parallel to a direction of the grooves of the light reflecting plane 5c and perpendicular to a module light receiving plane 2. Moreover, as illustrated in FIG. 10B, the second grooves 24 are provided on the light reflecting plane in a direction that intersects the above-described grooves. Hereinafter, the grooves 24 are referred to as secondary grooves 24. The incident angle, upon the module light receiving plane 2, of a light beam reflected on the light reflecting plane 5C becomes large as compared with the case where the secondary grooves 24 are not provided, so that a probability of undergoing total internal reflection on the module light receiving plane 2 is increased to enhance the light collection efficiency. By the way, an opening angle formed by a pair of inclined planes on each of the secondary grooves 24 is equal to, ideally, 120° in order to prevent a phenomenon that a light beam, which is reflected on one of the inclined planes forming each of the secondary grooves 24, enters the other inclined plane opposed thereto. In addition, when the opening angle is in the range of 100° to 160°, a decrease in the light collection efficiency has been found to be 10% or smaller as compared with the decrease in the case of the aperture angle of 120°. Also, when the aperture angle is in the range of 110° to 130°, the decrease in the light collection efficiency has been found to be 3% or smaller.

Figure 11A:
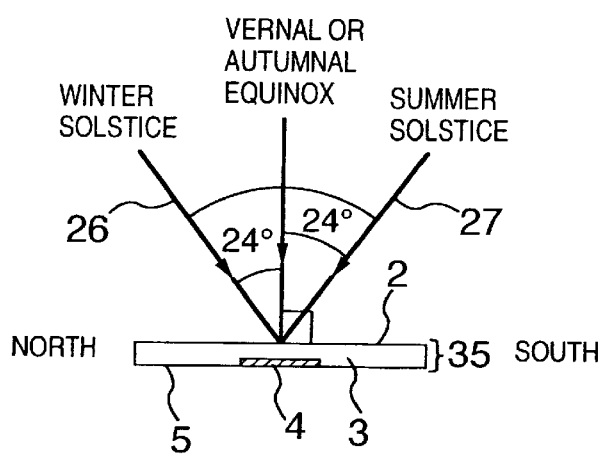
FIGS. 11A to 11C are diagrams for explaining a light collection efficiency of the light concentrator photovoltaic module according to the embodiment of the present invention.
Figure 11B:
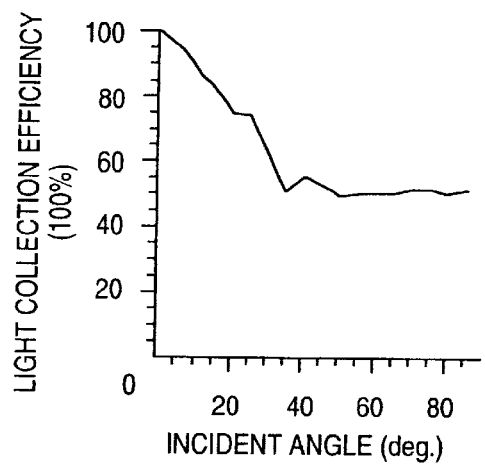
Figure 11C:
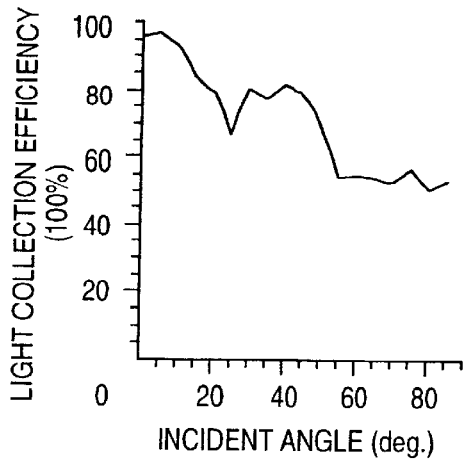

Next, referring to FIGS. 11A to 11C and FIGS. 12, 13, the explanation will be given below concerning a cost-reducing effect of the photovoltaic module based on the structures explained up to now. FIGS. 11A to 11C illustrate examples of the light collection efficiencies of the light concentrator photovoltaic module according to an embodiment of the present invention. As illustrated in FIG. 11A, the sun moves by ±24° in a north or south direction with a position at the time of vernal or autumnal equinox as the center. FIG. 11A shows a case for the southern hemisphere. When a light concentrator photovoltaic module 35 is placed in such a manner that the normal thereof coincides with a direction of the sun at the time of culmination of the vernal or autumnal equinox, as illustrated in the drawing, an incident angle of a solar light beam toward a module light receiving plane 2 changes by 24° in the north-south direction within a year. Accordingly, in order to effectively collect the resultant solar light beams into the photovoltaic module, it is important to enhance the light collection efficiency in the incident light beams of the incident angle ranging from to 0° to 24°. FIG. 11B illustrates an incident angle dependence of the light collection efficiency in the case of using a flat board-shaped photovoltaic element 4 the concentration ratio of which is equal to 2. It can be seen therefrom that light beams of an incident angle ranging up to 24° can be collected with a light collection efficiency of 75% or higher. Also, FIG. 11C illustrates a light collection efficiency of the photovoltaic module including the light reflecting member having the secondary grooves illustrated in FIGS. 10A, 10B. FIG. 11C indicates that forming the secondary grooves in this way makes the following possible: Increasing up to about 80% or higher the light collection efficiency of the light beams of an incident angle ranging up to 24°, and extending up to about 45° an incident angle corresponding to the light collection efficiency of about 75% or higher.

Figure 1A:
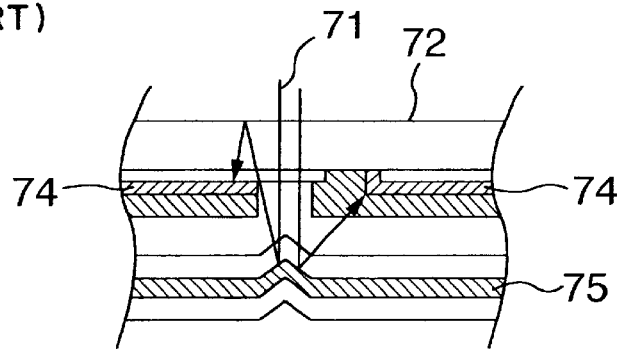
FIG. 1A is a cross sectional view illustrating an example of a conventional light concentrator photovoltaic module.
Figure 1B:
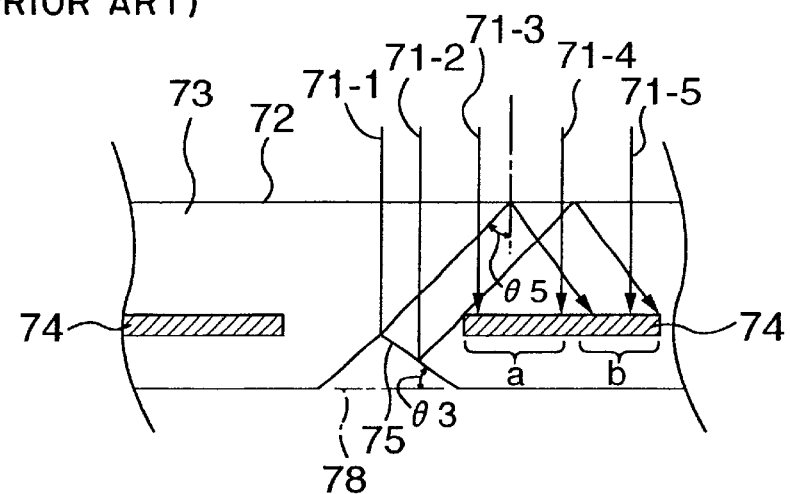
FIG. 1B is a diagram for explaining the operation in FIG. 1A.
Figure 2:
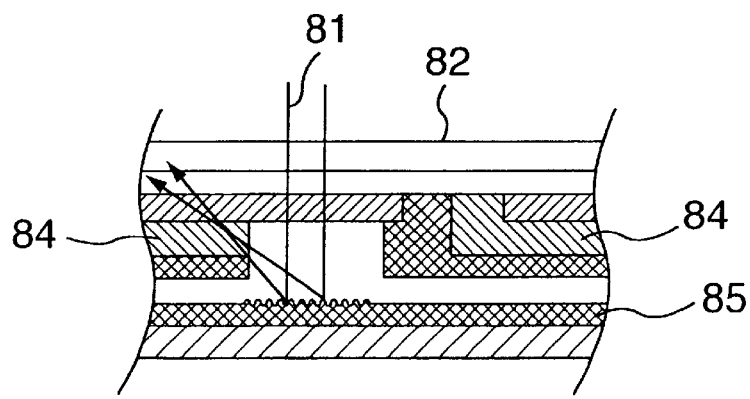
FIG. 2 is a cross sectional view illustrating another example of the conventional light concentrator photovoltaic module.
Figure 3A:
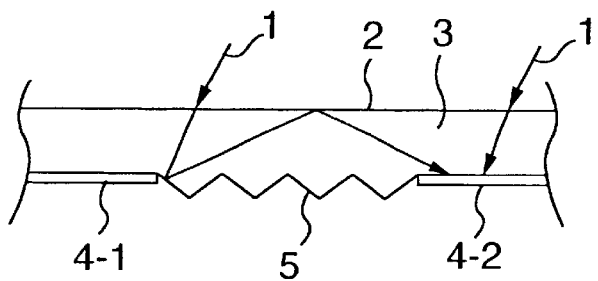
FIGS. 3A to 3D are cross sectional views of a light concentrator photovoltaic module according to an embodiment of the present invention.
Figure 3B:
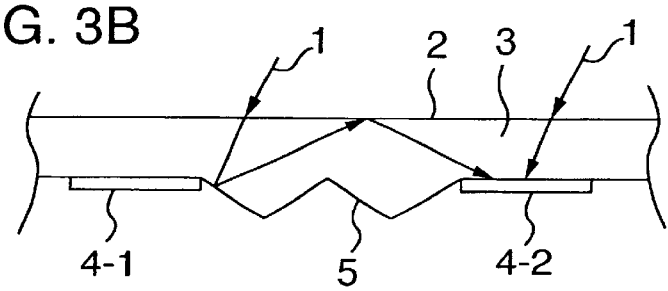
Figure 12:
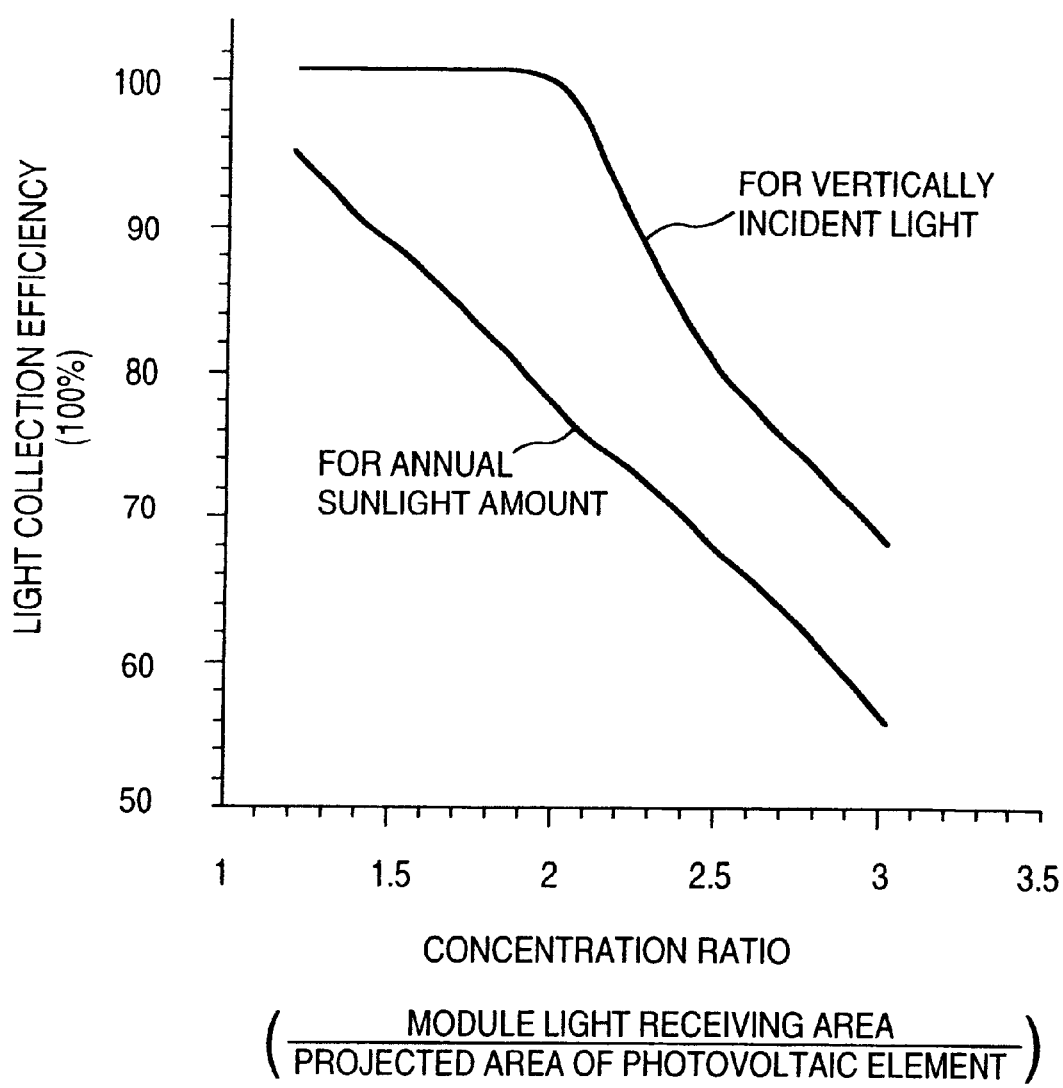
FIG. 12 is a diagram for explaining the light collection efficiency of the light concentrator photovoltaic module according to the embodiment of the present invention.
Figure 13:
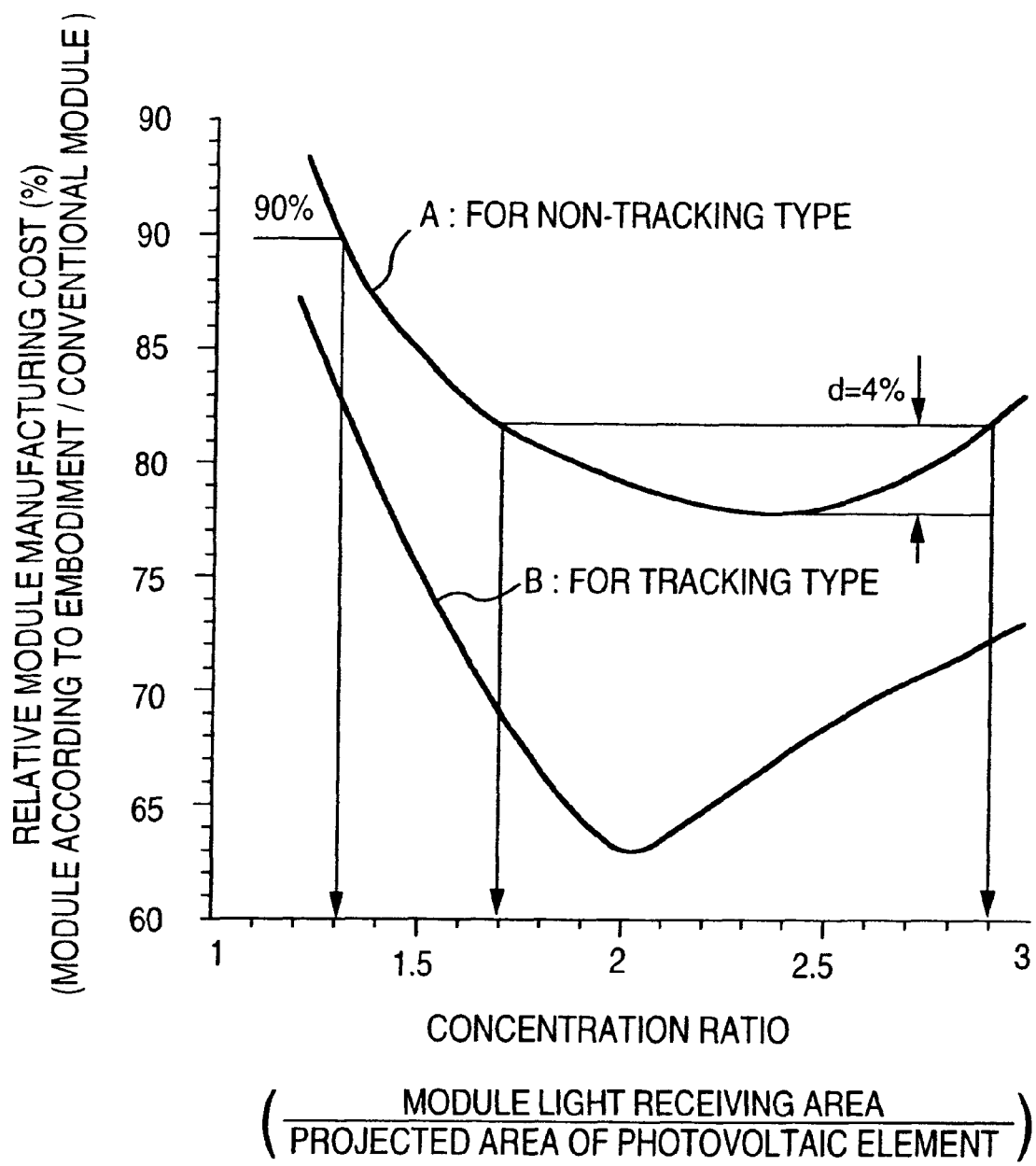
FIG. 13 is a diagram for explaining a module cost of the light concentrator photovoltaic module according to the embodiment of the present invention.

Taking into consideration the above-described incident angle dependence of the light collection efficiencies, a concentration ratio dependence of the light collection efficiency upon solar radiation of the light concentrator photovoltaic module of the structure with the flat board-shaped photovoltaic element with no secondary grooves is shown in FIG. 12. FIG. 12 indicates the following: The incident angle of the solar light beam changes depending on the seasons, and thus the light collection efficiency of a light beam entering at an angle smaller than right angles becomes other than the light collection efficiency of the light beam entering at right angles. Namely, as the concentration ratio becomes larger, the light collection efficiency is decreased. From the relation like this between the light collection efficiency and the concentration ratio, a manufacturing cost of the light concentrator photovoltaic module according to an embodiment of the present invention turns out to be as illustrated in FIG. 13. Here, it is assumed that a manufacturing cost of the conventional type photovoltaic module with no concentration is equal to 100%. Moreover, when the light concentrator photovoltaic module using the structure according to the embodiment of the present invention illustrated in FIG. 3A is set in such a manner that it is fixed toward the south, the module manufacturing cost is presented by a non-tracking type curve A in FIG. 13. In a region where the concentration ratio is small, as the concentration ratio becomes larger, the module manufacturing cost is decreased. If, however, the concentration ratio exceeds 2.4, the decrease in the light collection efficiency becomes conspicuous. Thus, as the concentration ratio gets higher, the cost is, conversely, increased. This shows that a concentration ratio resulting in the most tremendous cost-reducing effect in a region of a 4% cost ratio variation falls in the range of 1.7 to 2.8.

Figure 14A:
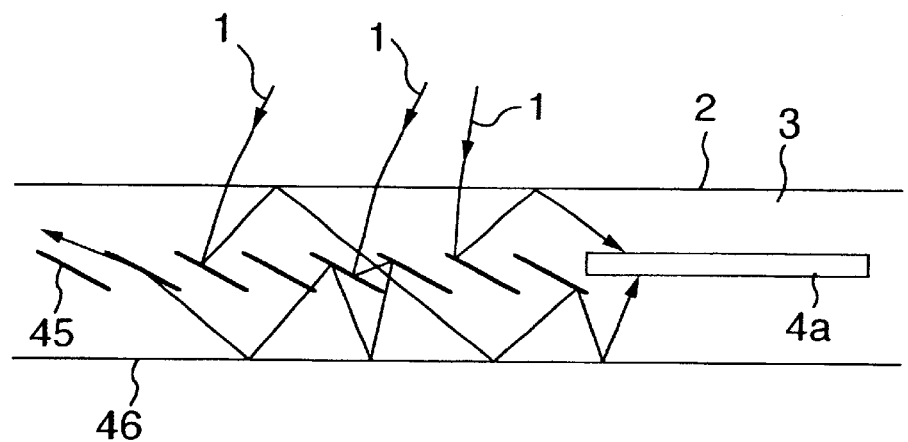
FIGS. 14A to 14C are cross sectional views of the light concentrator photovoltaic module according to the embodiment of the present invention.
Figure 14B:
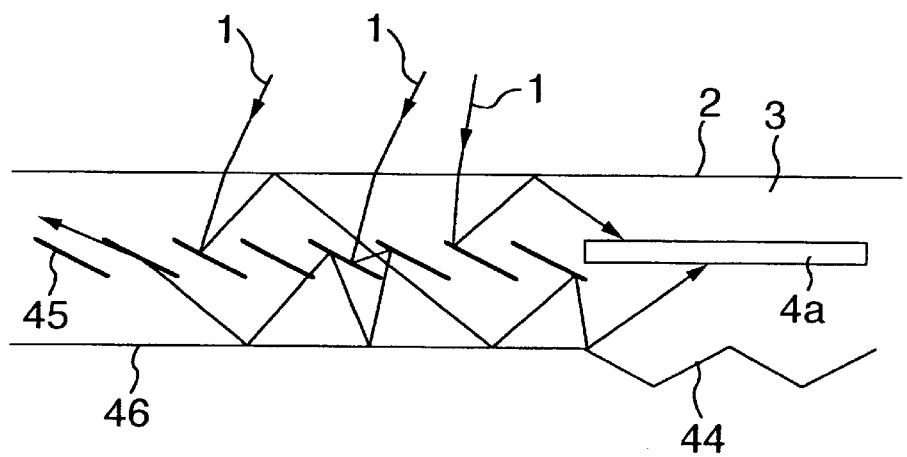
Figure 14C:
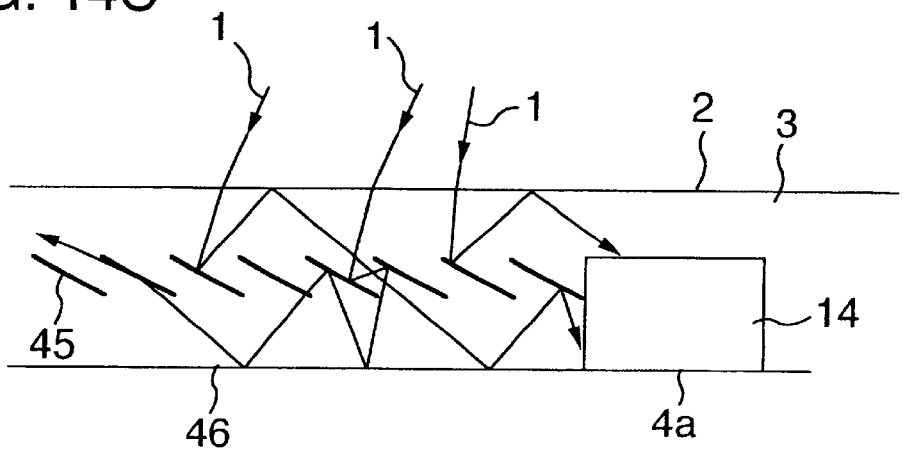

FIGS. 14A to 14C are diagrams illustrating the above-described cross sectional plane of a photovoltaic module. The photovoltaic module illustrated in FIG. 14A includes light reflectors 45 and a substantially flat light reflecting plane 46. The light reflectors 45, inside a medium 3, include a plurality of juxtaposed light reflecting plates having an inclination in one and the same direction and located in parallel. The light reflector 46 is provided on a back surface (other primary surface) of the medium 3. In this structure, a portion of incident light beams, after being reflected by the light reflector 45 inside the medium 3 and undergoing total internal reflection on a module light receiving plane 2, enter a primary surface on the side of the module light receiving plane 2 of a photovoltaic element 4a. Here, the photovoltaic element 4a has two opposing primary surfaces as element light receiving planes. Also, a portion of the incident light beams, after passing between the light reflectors 45 and being reflected on the light reflector 46 on the back surface of the module, enter a back surface (the other primary surface) of the photovoltaic element 4a. In this way, in addition to the flat light reflector 46, by providing the light reflectors 45 within the medium 3, it becomes possible to cause the light beams, which have entered the module light-receiving plane 2, to enter the photovoltaic element 4a effectively. In this case, too, as illustrated in FIG. 14B, the configuration (refer to FIG. 5B) is employed in which the light reflecting plane 44 is provided under the photovoltaic element 4a, thereby making it possible to enhance the light collection efficiency even further. Also, in a case where, like a photovoltaic element 14 illustrated in FIG. 14C, the element is provided with light receiving planes on the side surfaces thereof as well, the light collection efficiency is also enhanced even further.

In the structures illustrated in FIGS. 5A to 5D and FIGS. 14A to 14C, too, similarly in the explanations up to now, the inclination angles of the inclined planes are varied depending on the set position of the light reflectors 45 or the secondary grooves are formed, thereby making it possible to enhance the light collection efficiency even further.

Figure 15:
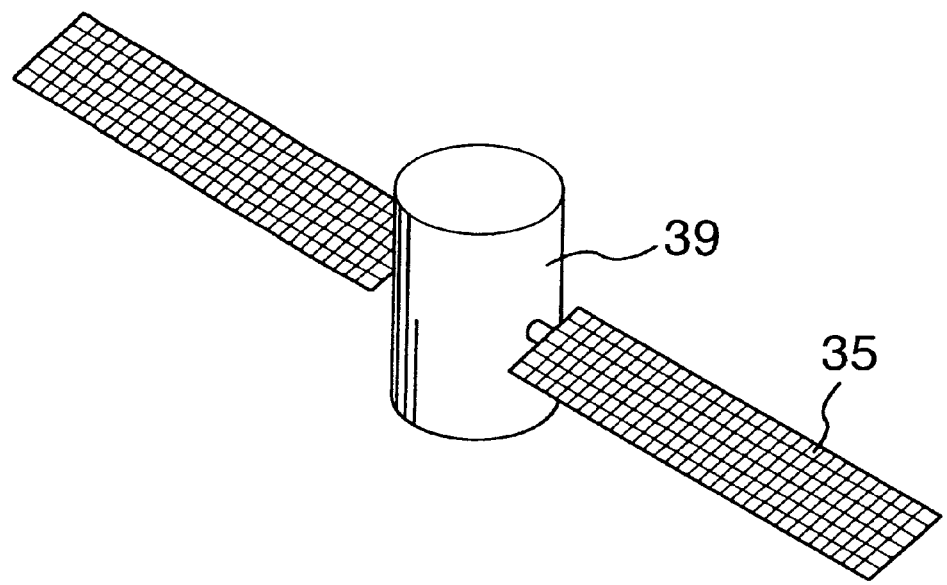
FIG. 15 is a diagram illustrating one structure of a light concentrator photovoltaic system according to another embodiment of the present invention.

In a conventional light concentrator photovoltaic module with a high concentration ratio in which the concentration ratio is enhanced more than ten times greater with the use of Fresnel lenses and so on, it is almost impossible to collect the solar light beams if the module light receiving plane is inclined by just 5° from a direction of the sun. Accordingly, it is required to always track the sun precisely so that the module light receiving plane is oriented toward the sun. In contrast to this situation, in the light concentrator photovoltaic module according to the present invention, as illustrated in FIGS. 11B, 11C as the examples thereof, if the normal of the module light receiving plane is inclined by about, for example, 5° from the direction of the sun, there occurs no significant decrease in the light collection efficiency. Consequently, it becomes possible to relax the tracking accuracy if the light concentrator photovoltaic module 35 according to the embodiment of the present invention is employed in a tracking type photovoltaic system using a mechanism that tracks the movement of the sun so that the module light receiving plane is always directed toward the sun. Then, taking full advantage of this characteristic, as is illustrated in FIG. 15, the photovoltaic module In the present invention can be used as, for example, a power supply for an artificial satellite 39. In the artificial satellite, controlling the attitude thereof allows angle adjustment of the module light receiving plane, thereby making it possible to direct the module light receiving plane toward the sun as much as possible. However, since the attitude controlling requires fuel, it is not at all easy to execute fine adjustment of the angle of the module light receiving plane for a long period of time. Thus, as the power supply for the artificial satellite like this, it is difficult to employ the conventional light concentrator photovoltaic module with a high concentration ratio. On the other hand, the light concentrator photovoltaic module 35 according to the embodiment of the present invention necessitates no subtle tracking, and accordingly it is suitable for the power supply of the artificial satellite.

In the structures explained until now, formation of the medium is made possible by using and laminating, for example, a flat board-shaped glass plate and a second medium having pits and projections. In particular, when a height of pits and projections for the grooves in the groove-shaped light reflecting plane is 1 mm or less, since the second medium having the pits and projections is prepared in the form of a groove-formed sheet, combination of the flat board-shaped medium and the groove-formed sheet-like medium allows the formation of the medium portion easily. Accordingly, it becomes possible to manufacture a photovoltaic module that is inexpensive at the material cost and is easy to manufacture. However, if a pitch of the grooves on the light reflecting plane becomes shorter than a wavelength of incident sunlight, it turns out that the reflection that the incident sunlight undergoes is not a regular reflection but an interference reflection. Thus, a direction of the reflected light is shifted from the direction explained until now. By the way, the shortest wavelength of the sunlight is equal to about 0.3 $\mu$m. Accordingly, in order not to cause the interference reflection when the sunlight is received, it is required to make the pitch of the grooves at least 0.3 $\mu$m or more. For this purpose, it is required to make the pits and projections in the light reflecting plane about 0.3 $\mu$m or more.

Also, the light reflecting plane may be formed in advance on the back surface of the groove-formed sheet-like medium, thereby providing a groove-formed reflection sheet. This process makes the manufacturing much easier. In this case, in order to maintain an accuracy of the inclination of the respective inclined planes In the light reflecting plane toward the module light receiving plane 2 to make the decrease in the light collection efficiency 10% or lower, it is necessary to set the groove-formed reflection sheet in parallel to the module light-receiving plane 2 with an accuracy of ±5°. Also, when it is important to reduce manufacturing errors of configuration of the inclined planes in the light reflecting plane or configurations of vertex portions and base portions of the light reflecting plane, it is desirable to make 1 mm or more width of a groove in a direction parallel to the module light receiving plane 2. Here, the groove includes a pair of inclined planes on the light reflecting plane.

Figure 16A:
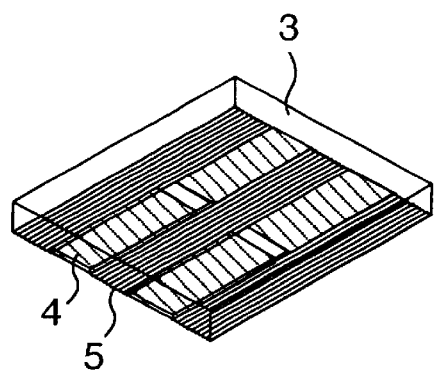
FIGS. 16A to 16E are diagrams illustrating one fabricating process of the light concentrator photovoltaic module according to the embodiment of the present invention.
Figure 16B:
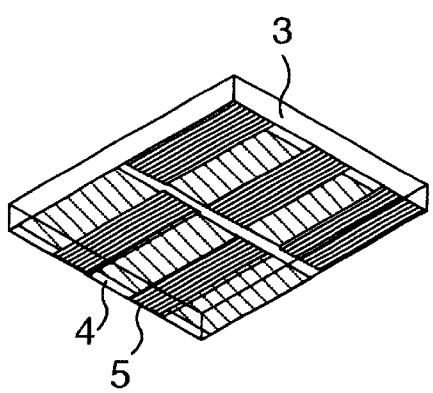

FIGS. 16A to 16E illustrate structures of a light concentrator photovoltaic module according to embodiments of the present invention. FIGS. 16A is a bird's eye view of a portion of the manufactured light concentrator photovoltaic module in which there are included 2 rows by 2 columns of photovoltaic elements 4 and 3 columns of groove-shaped light reflecting planes 5. In this structure, the plurality of photovoltaic elements 4 are located in a manner of being adjacent to each other and in a direction parallel to a direction of the grooves of the light reflecting planes 5. Thus, only one light reflecting plane 5 is sufficient for and corresponds to the plurality of photovoltaic elements 4, which makes the manufacturing easy. In contrast to this, locating the photovoltaic elements 4 and the light reflecting planes 5 alternately as illustrated in FIG. 16B increases the number of the components but enhances a light collection efficiency of light beams that have entered a module light receiving plane obliquely. Either of the structures can be manufactured by a basically similar method.

Figure 16C:
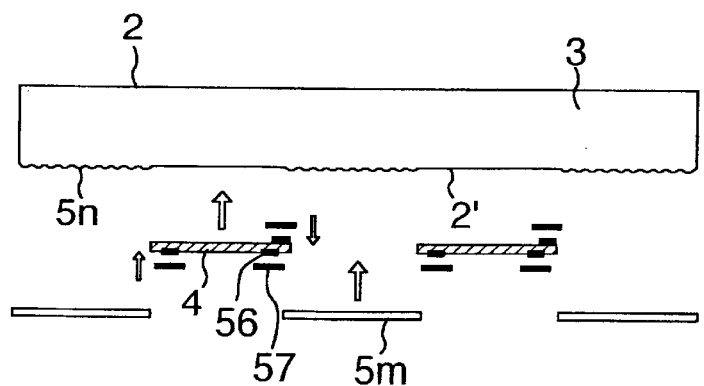
Figure 16D:
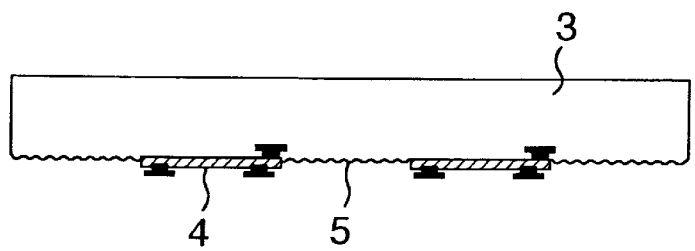
Figure 16E:
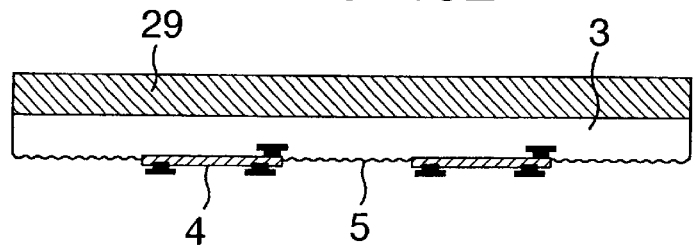

FIG. 16C illustrates a concrete method of manufacturing the structures. As a medium 3, a glass plate is used which has a first primary surface 2 and a second primary surface 2'. Here, the glass plate has a thickness of 3 mm, i.e., a distance between the two primary surfaces. Moreover, the first primary surface 2 functions as the module light receiving plane, and the second primary surface 2' is provided with a light reflecting plane. Desired V-shaped groove structures are formed in advance in portions where groove-shaped light reflecting planes are to be formed on the second primary surface 2'. Also, a plate-shaped solar battery, which is composed of crystalline silicon and only one of the surfaces of which is an element light-receiving plane, is used as the photovoltaic element 4. In addition, a negative electrode is provided on one of the surfaces of the plate-shaped solar battery, and a positive electrode is provided on the other surface thereof. The V-shaped grooves formed on the second primary surface 2' of the medium 3 form an inclination angle of 30° with respect to the module light receiving plane 2, and form an opening angle of 120°. A distance between a virtual plane containing vertexes on one side of the V-shaped grooves and another virtual plane containing vertexes on the other side of the V-shaped grooves (hereinafter, referred to as thickness of the groove-shaped light reflecting plane 5) is 200 μm. A light reflecting film 5 m prepared which includes a copper plate 20 μm thick with silver coated thereon to a thickness of 1 μm, thereby forming a light reflecting plane. According to the formula (6), in a direction perpendicular to a direction of the length of the V-shaped grooves, an optimum length of the light reflecting plane 5 and that of the solar photovoltaic element 4 become equal to 10.4 mm. Thus, the length of the light reflecting plane 5 and that of the photovoltaic element 4 have been set to be 10.4 mm. Also, as electrical interconnections, a nickel-plated copper wire 20 μm thick and 0.8 mm wide is used. First, an electrical interconnection 57 is soldered to an electrode 56 on the solar photovoltaic element 4. Next, the solar photovoltaic element 4 and the flat plane-shaped light reflecting film (light reflecting member) 5m bare bonded to the medium 3 with the use of an ethylene-vinyl acetate polymer (EVA), thereby fabricating the structure illustrated in FIG. 16D. The flat plane-shaped light reflecting film 5m is pressed onto the groove-formed light reflecting plane 5n on the second primary surface 2' of the medium 3 on which the V-shaped grooves have been formed in advance, thereby forming the groove-shaped light reflecting plane 5 provided with the V-shaped grooves. When reliability in electrical insulation is requested, an insulating sheet has been inserted between the light reflecting plane 5 and the electrical interconnection 57 or the electrode 56. When weather protection is requested, depending on the request, the back surface of the structure illustrated in FIG. 16D has been covered with a back surface protecting layer that is composed of polyvinyl fluoride (PVF) and so on. Also, when a factor such as weight reduction is regarded as important, a resin such as an acrylic resin or polycarbonate has been used as the medium 3. Also, when an enhancement in strength is important along with the weight reduction, as illustrated in FIG. 16E, a second medium 29 composed of glass is provided on the surface on the module surface side of the medium 3 made of the resin, which results in a two layer structure. Under the condition that the concentration ratio is equal to 2, this structure has made it possible to collect, into the photovoltaic elements 4, all of the light beams that have entered the module light receiving plane 2 at right angles. In FIGS. 16A to 16E, the light reflecting plane 5 includes a plurality of sheets. It is needless to say, however, that it is allowable to use a certain number of these sheets integrated in a transverse or vertical direction or a single sheet resulting from integrating all of the plurality of sheets.

Figure 17A:
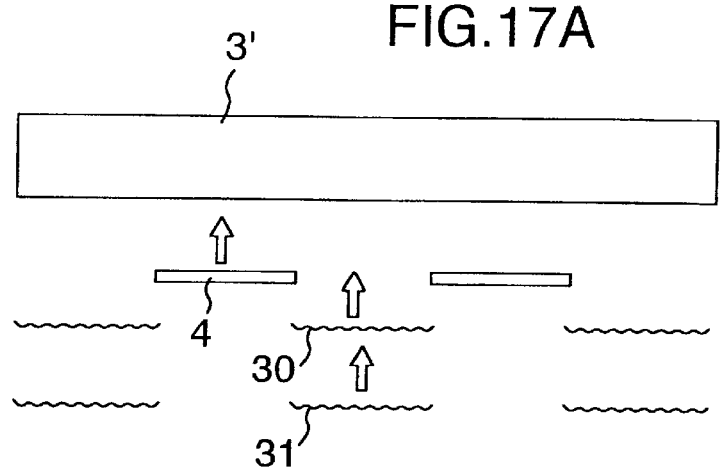
FIGS. 17A and 17B are diagrams illustrating one fabricating process of the light concentrator photovoltaic module according to another embodiment of the present invention.
Figure 17B:
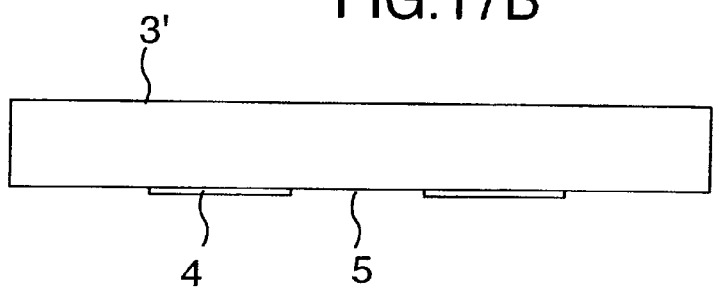

FIGS. 17A 17B illustrate a structure of a light concentrator photovoltaic module according to another embodiment of the present invention. The structure according to this embodiment corresponds to a case where there are not provided the V-shaped groove-like pits and projections, which, in FIG. 16C, are provided on the second primary surface 2' on the glass plate 3. Therefore, a planarizing layer 30 composed of a resin is inserted between a medium 3' and a light reflecting film (light reflecting member) 31. This structure has made it possible to use a flat plate-shaped glass of a low manufacturing cost. Also, when using, as the medium 3', a glass plate on the back surface of which there are formed pits and projections that are different in shape from the desired V-shaped grooves, the pits and projections are filled with an agent such as the EVA. Here, the EVA functions as an adhesive agent as well for bonding the glass plate and the light reflecting plane 5 0r the photovoltaic elements 4. This process has made it possible to manufacture a structure similar to that of the glass plate having the planarized surface.

Figure 18A:
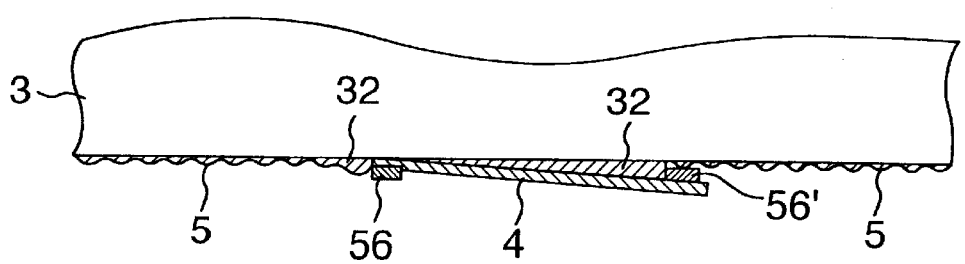
FIGS. 18A and 18B are cross sectional views of the light concentrator photovoltaic module according to another embodiment of the present invention.
Figure 18B:
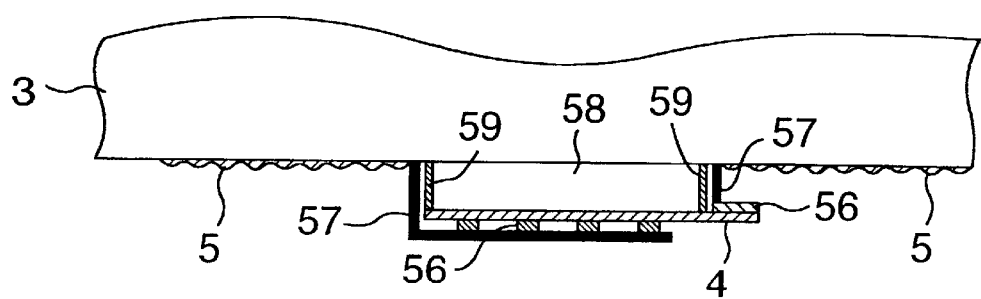

FIGS. 18A, 18B illustrate a structure of a light concentrator photovoltaic module according to another embodiment of the present invention. The structure according to this embodiment is a case where there is employed a different manner of arranging the photovoltaic elements in FIGS. 17A, 17B. When the electrodes are composed of a material of low light transmittancy such as a metal and so on, even if a light beam enters an electrode, the light beam is reflected or absorbed by the electrode, thus making no contribution to the photovoltaic power generation. Meanwhile, in a structure in FIG. 18A, an electrode 56', which is formed on a light receiving plane side of the photovoltaic element 4, is formed under the groove-shaped light reflecting plane 5. Consequently, on the light entering plane of the photovoltaic element 4, there exists none of the portions that shield incoming light beams. This allows the light collection efficiency to be enhanced. Although, in this structure, the photovoltaic element 4 is slightly inclined toward he back surface of the medium 3, this inclination exerts almost no influence upon the light collection efficiency. Also, a space formed between the medium 3 and the photovoltaic element 4 is filled with a medium such as the EVA that functions as a transparent adhesive layer 32. This enables a high light collection efficiency to be obtained. In this way, the adhesive layer 32, which bonds the medium 3 and the photovoltaic element 4 or the medium 3 and the light reflecting plane 5, also serves as a portion of the medium. Accordingly, it is possible to assume that the medium 3 and the photovoltaic element 4 or the medium 3 and the light reflecting plane 5 are substantially in direct contact with each other. Here, it is needless to say that this also holds in the case where, in the other structures, there exists an adhesive layer between the medium and the photovoltaic element or the medium and the light reflecting plane. Also, in this structure, an electrical conductive material is used as the light reflecting plane 5 or the electrical conductive material is brought into close contact with the light reflecting plane 5, thereby making it possible to modify this structure into a structure that functions not only as a light reflecting plane but also as electrical interconnections. FIG. 18B illustrates a structure where, from reasons such as facilitating interconnections among the electrodes in the photovoltaic element, there is provided a medium 58 also between the photovoltaic element 4 and a direct extension line of the light reflecting plane 5. In such a structure, side surface light reflecting planes 59 are provided on the side surfaces of the medium 58, thereby making it possible to prevent a lowering in the light collection efficiency. Also, the above-described direct extension line of the light reflecting plane is regarded and used as the light receiving plane of the photovoltaic element, and length of the light reflecting plane and that of the photovoltaic element are set as explained hereinbefore. This allows the light collection efficiency to be enhanced. Numeral 57 represents a lead for the photovoltaic element 4.

Figure 19A:
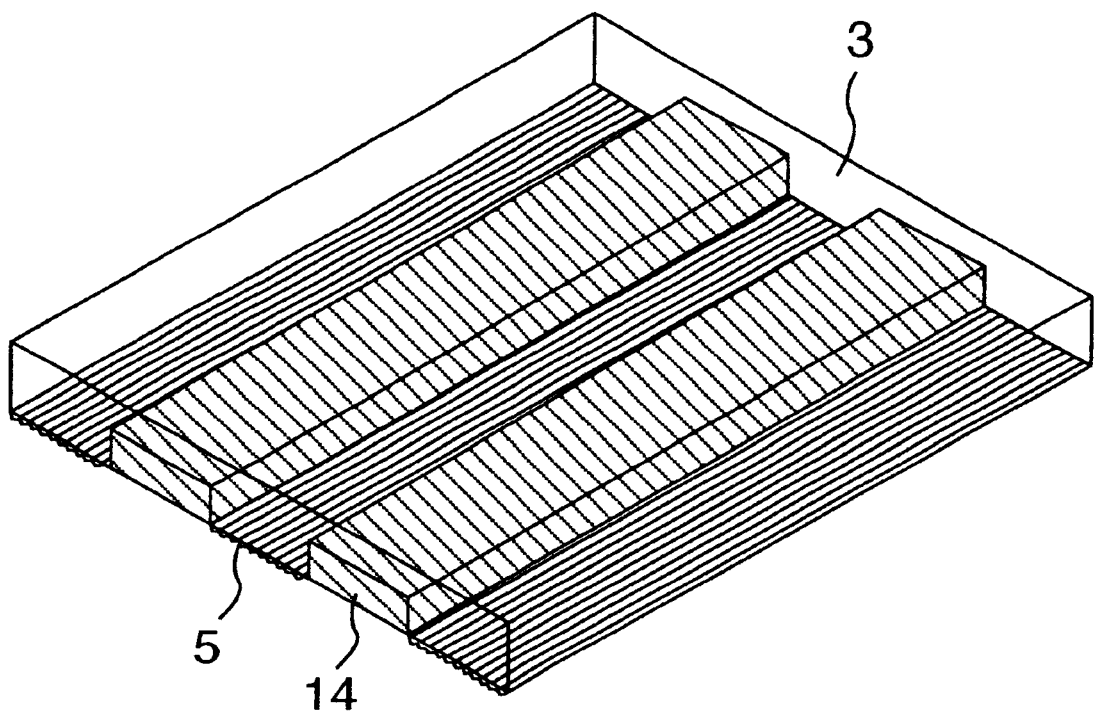
FIGS. 19A and 19B are a perspective view and a cross sectional view of the light concentrator photovoltaic module according to another embodiment of the present invention.
Figure 19B:
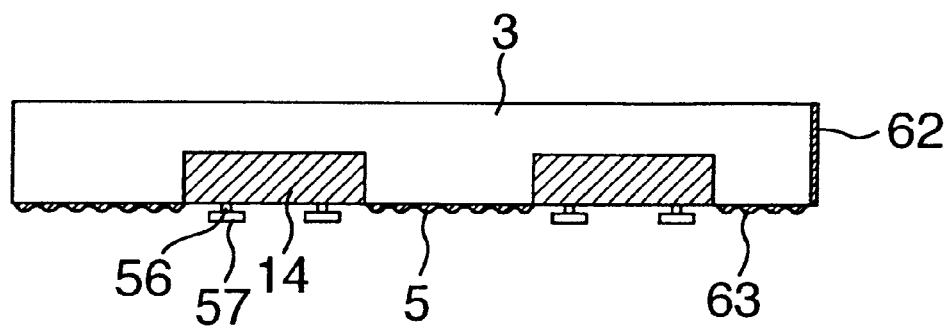

FIGS. 19A, 19B illustrate an embodiment where there are employed the thick plate-shaped photovoltaic elements 14 explained with reference to FIG. 3A. In this structure, as illustrated in the cross sectional view in FIG. 19B, there are employed a medium 3, which is 3 mm thick and has recesses, and the thick plate-shaped photovoltaic elements 14, which are 1.5 mm thick and have a shape fitted into the recesses. It is possible to form the medium 3 of the configuration like this with the use of glass, but it is difficult to suppress the manufacturing cost to a lower level. Consequently, in the present embodiment, the medium 3 has been formed using a transparent resin. As a material of the resin, polycarbonate or an acrylic resin has been used. Also, when weather protection is important, a module light receiving plane 2 is strengthened by using such methods as coating the light receiving plane with glass or sticking a glass plate onto the surface of the light receiving plane. The thick plate-shaped photovoltaic elements 14, which has element light receiving planes on the upper surface and the side surfaces, are inserted into the recesses of the medium 3, thereby, using the methods explained hereinbefore, forming a groove-shaped light reflecting plane 5 that forms an inclination angle of 30° toward the module light receiving plane 2. After that, positive and negative back surface electrodes 56, which are adjacent to each other and are situated on the back surface of the thick plate-shaped photovoltaic element 14, are connected in series by using an electrical interconnection 57. In a direction perpendicular to a direction of the length of the grooves in the light reflecting plane 5 (i.e., a right-to-left direction in the figure), width of the light reflecting plane 5 and that of the thick plate-shaped photovoltaic element 14 have been set to be 2.6 mm and 1.5 mm, respectively. Accordingly, width of the projection of the thick plate-shaped photovoltaic element 14 onto the module light-receiving plane 2 becomes equal to 1.5 mm, and the concentration ratio is equal to 2.7. However, since the light receiving plane of the thick plate-shaped photovoltaic element 14 is positioned deep inside the medium 3 as compared with the flat plate-shaped photovoltaic element, the light collection efficiency for the solar radiation has been found to be 91%, which is an exceedingly high value. Even in the case where the concentration ratio is equal to 4, the light collection efficiency has been found to be 81%. Also, a side surface light reflecting plane 62 is provided on the side surface of the module. This has made it possible to increase amount of the sunlight that enters a photovoltaic element positioned at the edge of the module. Also, when incident angles of incident light beams fall in a narrow range, the following has been found out: Even if width of a light reflecting plane 63 positioned at the edge of the module is made smaller than that of the light reflecting plane 5 positioned in proximity to the center of the module, amount of the sunlight that enters the photovoltaic element positioned at the edge of the module is substantially equal to amount of the sunlight that enters a photovoltaic element positioned in proximity to the center of the module.

Figure 20A:
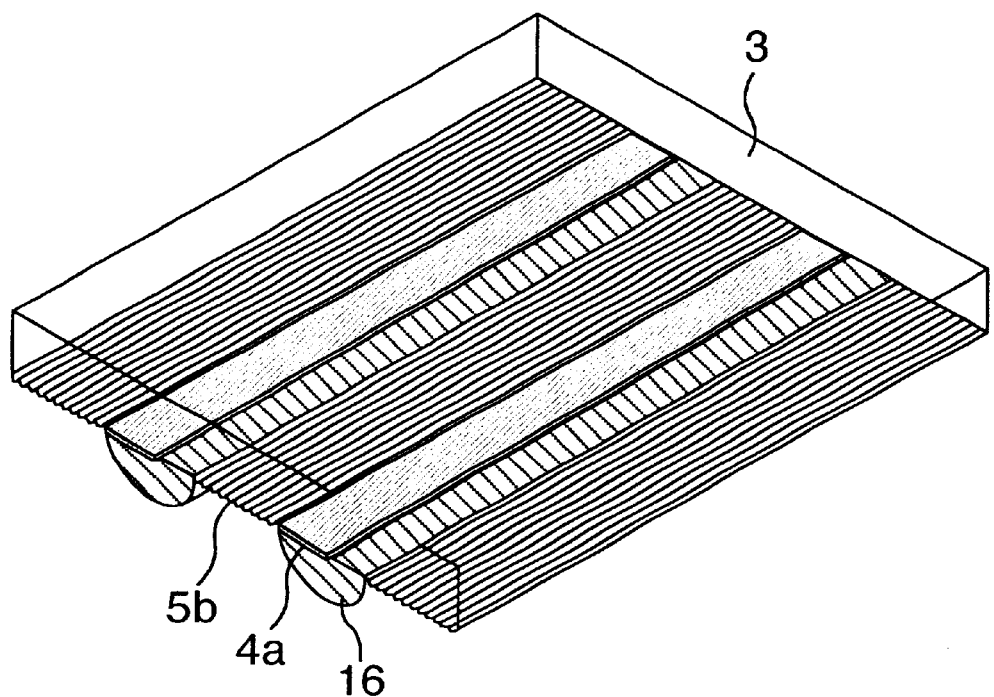
FIGS. 20A and 20B are a perspective view and a cross sectional view of the light concentrator photovoltaic module according to another embodiment of the present invention.
Figure 20B:
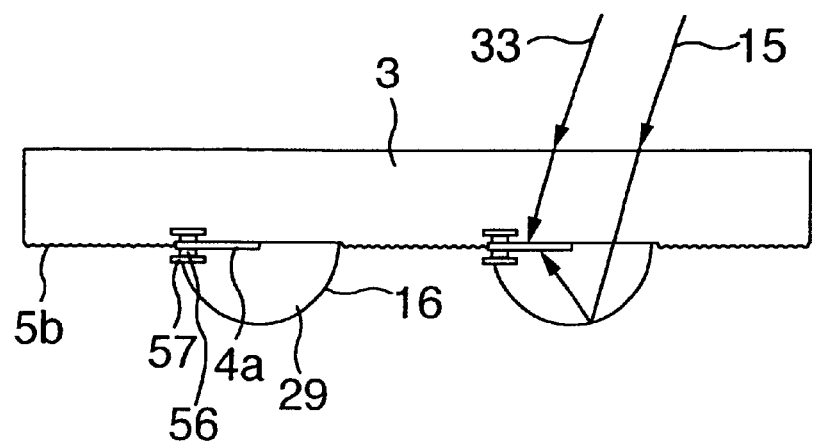

FIGS. 20A, 20B illustrate an embodiment corresponding to a case where, in the embodiment explained in FIGS. 16A to 16E, the photovoltaic element 4 is made one-half in length. The main fabrication process is basically the same as that illustrated in FIGS. 16C to 16E, but what is different from the above-mentioned embodiment is as follows: Using a circular arc-shaped light reflecting plane 16 and a flat plate-shaped double-sided light receiving photovoltaic element 4a instead of the photovoltaic element 4 in the above-mentioned embodiment, the light reflecting plane 16 and the photovoltaic element 4a have been bonded to a medium 3. Here, the inside of the light reflecting plane 16 is filled with a second medium 29, and the photovoltaic element 4a has a width that is as long as a radius of the circular arc. The use of this structure has made it possible to make one-half a substrate area of the photovoltaic element 4, thus allowing the photovoltaic module manufacturing cost to be reduced by about 25%. In this structure, it had been already explained that almost the same effect can be obtained even if configuration of the circular arc-shaped light reflecting plane 16 is shifted from the perfect circle (refer to FIG. 7 and the related explanation). In view of this, in order to decrease height of the circular arc-shaped light reflecting plane 16, a structure has been manufactured in which a configuration is employed, including a portion of an ellipse obtained by pulling and extending the circular arc-shaped light reflecting plane 16 in a right-to-left direction by 20%. At this time, a decrease in the light collection efficiency for the solar radiation has been found to be 2%. Also, a structure has been manufactured in which the inside of the circular arc-shaped light reflecting plane 16 is not filled with the medium 29. In this case, although the light collection efficiency is decreased by 5%, it has become easier to manufacture the circular arc-shaped light reflecting plane 16 (this plane being made of, e.g., Al or Ag), thus making it possible to reduce the module manufacturing cost. Also, the radius of the circular arc-shaped light reflecting plane 16 is made smaller so that an electrode 56 on the back surface is positioned outside the circular arc-shaped light reflecting plane 16. This has allowed the light collection efficiency to be enhanced even further.

Figure 21A:
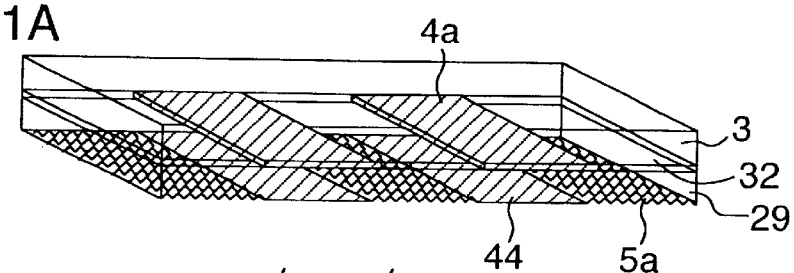
FIGS. 21A to 21F are a perspective view and cross sectional views of the light concentrator photovoltaic module according to another embodiment of the present invention.
Figure 21B:
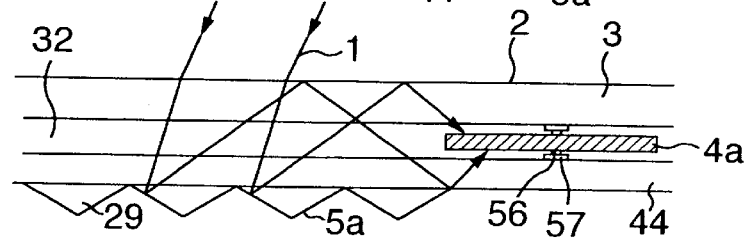
Figure 21C:
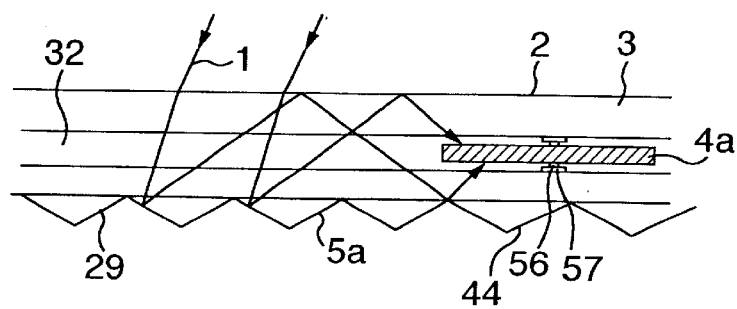
Figure 21D:
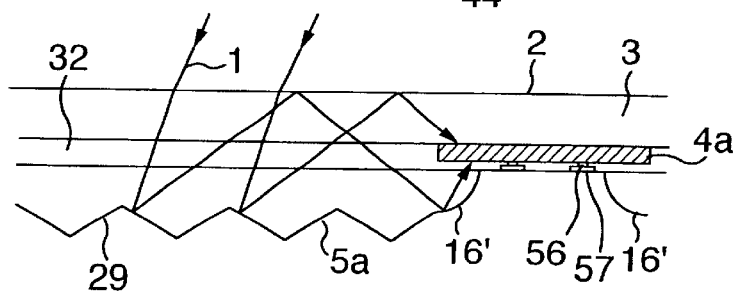
Figure 21E:
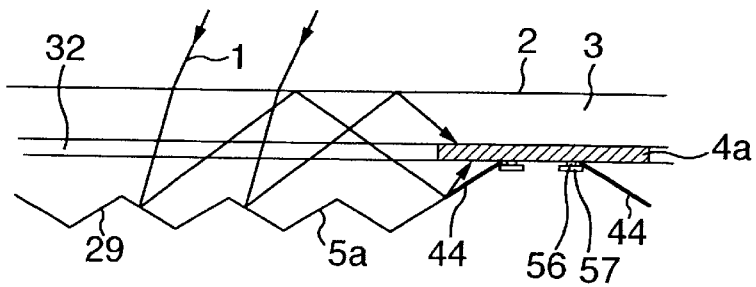
Figure 21F:
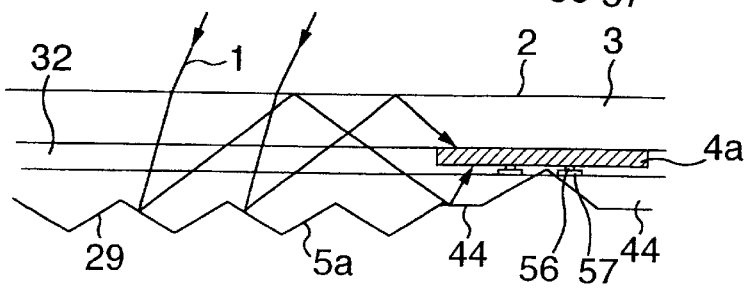

FIGS. 21A to 21F illustrate an embodiment where a flat plate-shaped double-sided light receiving photovoltaic element 4a is positioned inside the medium 3 explained in FIG. 5B, and the light reflecting plane 44 is provided under the photovoltaic element 4a. In this structure, since the photovoltaic element 4a is buried inside the medium 3, the medium is not integrally molded. Instead, the medium 3 is separated from a second medium 29 by an adhesive layer 32, and the photovoltaic element 4a with which an electrical interconnection 57 is connected is sandwiched between the upper and the lower mediums, and then the upper and the lower mediums are bonded together by the adhesive layer 32. FIG. 21B is a cross sectional view of the structure in FIG. 21A. Herein, each of the inclined planes in the light reflecting plane forms an angle of 30° toward the module light-receiving plane 2, and a distance between the module light receiving plane 2 and a plane of the solar photovoltaic element 4a that is opposed to the module light receiving plane 2 is equal to 3 mm, and a distance between the module light receiving plane 2 and the virtual plane containing vertexes of the light reflecting planes 5a is equal to 6 mm. Accordingly, based on the formulae (12), (13), length of light reflecting plane 5a and that of the photovoltaic element 4 have been determined to be 20.8 mm and 10.4 mm, respectively. Also, a flat plane-shaped light reflecting plane 44 is formed under the photovoltaic element 4. Moreover, FIG. 21C illustrates an embodiment where, under the photovoltaic element 4a, there is formed a light reflecting plane 44 that is provided with grooves forming an inclination angle of 20° with the module light receiving plane 2. Forming, in this way, the light reflecting plane 44 with the grooves under the photovoltaic element as well has enhanced a light collection efficiency at the lower surface of the photovoltaic element. Furthermore, FIG. 21D illustrates an embodiment where a circular arc-shaped light reflecting plane 16' is used under the photovoltaic element 4a. Using the circular arc-shaped light reflecting plane in this way has allowed light beams, which has entered the medium under the photovoltaic element 4a, to be collected effectively onto the back surface of the photovoltaic element 4a. Also, a configuration of the light reflecting plane 44 under the photovoltaic element 4a is simplified into a configuration illustrated in FIG. 21E or FIG. 21F, which has made it easier to mold the second medium 29. At this time, in comparison with the case where the circular arc-shaped light reflecting plane is used, the decrease in the light collection efficiency for the solar radiation has been found to be 2 to 5%. In the structure like this, it is also needless to say that the thick plate-shaped or the cube-shaped photovoltaic element 4, the side surfaces of which also serve as light receiving planes, is employed, thereby allowing the light collection efficiency to be enhanced even further. Also, when a material such as a resin is employed as the medium, it is also possible to integrally mold, by resin molding, a configuration including the medium 3, the second medium 29 and the adhesive layer 32.

Figure 22A:
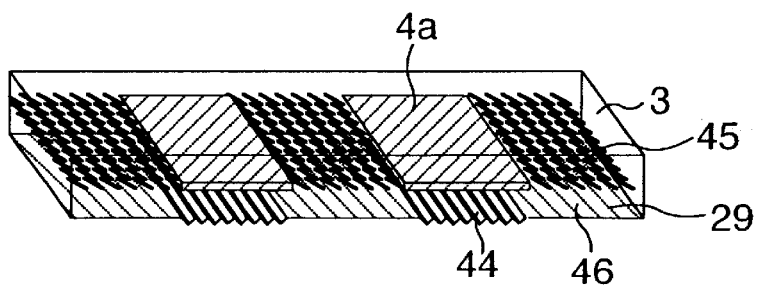
FIGS. 22A to 22E are a perspective view and cross sectional views of the light concentrator photovoltaic module according to another embodiment of the present invention.
Figure 22B:
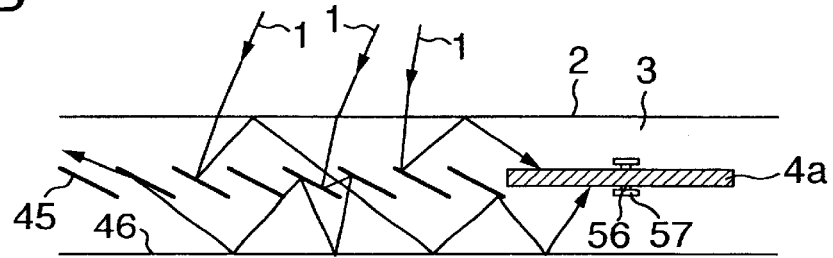
Figure 22C:
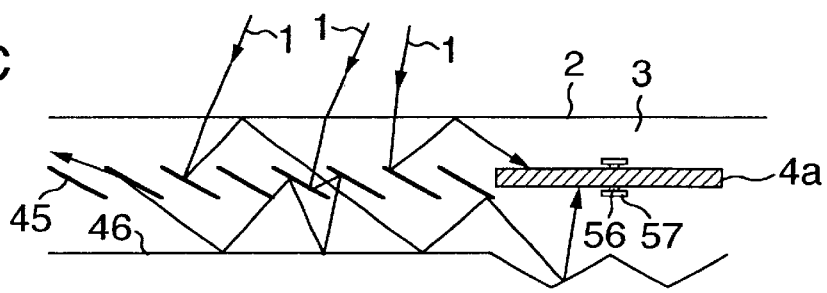
Figure 22D:
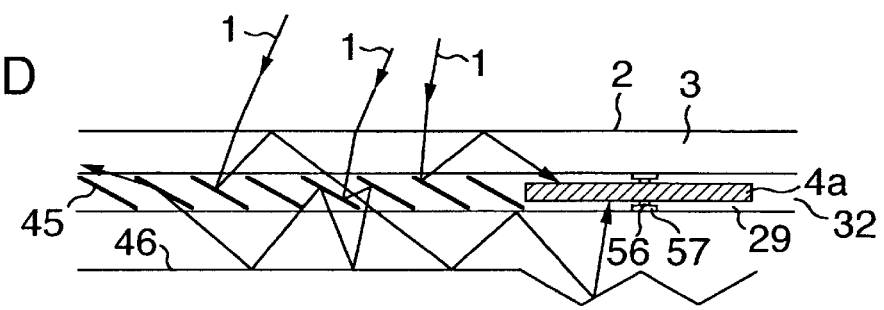
Figure 22E:
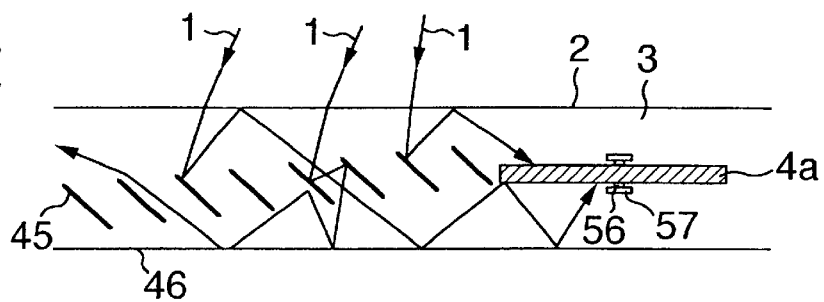

FIG. 22A illustrates an embodiment where there is employed a plurality of light reflecting plates 45 such as explained with reference to FIGS. 14A, 14B and positioned inside the medium 3. In this structure, both the photovoltaic element 4a and the light reflecting plates 45 are positioned inside the medium 3. The simplest configuration of such a light concentrator photovoltaic module is a structure the above-described cross sectional plane of which is illustrated in FIG. 22B. The photovoltaic element 4a with which the electrical interconnection is provided and arrangement of the plurality of light reflecting plates are, inside the medium 3, parallel to the module light receiving plane 2. The configuration like this can be formed in the following way: First, the photovoltaic element 4a and the arrangement of the plurality of light reflecting plates are supported in parallel to the light receiving plane 2 inside a mold frame the shape of which corresponds to configurations of a back surface and side surfaces of the light concentrator photovoltaic module. Then, a thermosetting or light-hardening resin is injected into the mold frame and then is hardened, thereby forming the configuration. Also, the light reflecting plates 45 can be formed directly on the back surface of the medium by using a vacuum evaporation method or a plating method, or can be formed by bonding sheets having a light reflecting plane. In the present embodiment, thickness of the medium 3 has been set to be 3.2 mm, and height of the light reflecting plates inside the medium in a direction perpendicular to the module light receiving plane has been set to be 0.5 mm. FIG. 22C illustrates a structure where a light reflector under the photovoltaic element 4a is provided with a groove-shaped light reflecting plane 44. In the present embodiment, an inclination angle formed by the grooves of the groove-shaped light reflecting plane 44 and the module light receiving plane 2 is set to be 20°, and height of the grooves in the direction perpendicular to the module light-receiving plane is set to be 0.1 mm. FIG. 22D illustrates a structure where the medium includes the medium 3, the second medium 29 and the adhesive layer 32. Although this structure is, essentially, the same as the above-described structure in FIG. 22C, the structure is divided into the three layers for simplicity in the manufacturing. In this structure, the light reflecting plates 45 are located between the medium 3 and the second medium 29, and then the use of the adhesive layer 32 has made it possible to bond the three layers as well as to fill this intermediate layer with the adhesive layer. FIG. 22E illustrates an embodiment where the stripe array of the light reflecting plates 45 is inclined with respect to the module light receiving plane 2. When manufacturing such a structure, forming the medium integrally rather than separating the medium into multilayers makes the manufacturing easier. In this way, the stripe array of the light reflecting plates 45 has been inclined with respect to the module lightreceiving plane 2, thereby making it possible to effectively collect light beams that have entered the module light receiving plane obliquely.

Figure 23:
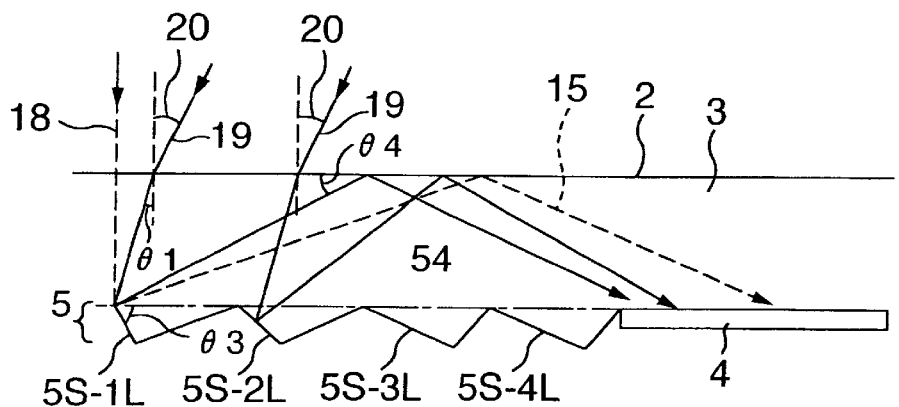
FIG. 23 is a cross sectional view of the light concentrator photovoltaic module according to another embodiment of the present invention.

FIG. 23 illustrates, in the above-described cross sectional plane, a structure of a light concentrator photovoltaic module according to another embodiment of the present invention. In this structure, as illustrated in FIG. 8, on the back surface of the module (i.e., the primary surface of the medium 3 opposed to the module light-receiving plane 2), the inclination angles of the leftwardly ascending inclined planes 5S-1L to 5S-4L in the groove-shaped light reflecting plane 5 are varied depending on how far each of the inclined planes is to the photovoltaic element 4. Glass with a refractive index of 3 has been used as the medium 3. A distance between the module light receiving plane 2 and vertexes of the inclined planes in the light reflecting plane has been taken as 3 mm, and length of the groove-shaped light reflecting plane has been taken as 10 mm. Moreover, the structure of the photovoltaic module has been designed so that it is the most suitable for the case where the module light receiving plane 2 is set at right angles toward the solar light beams at the time of culmination of the vernal equinox. In this case, an inclination angle of a solar light beam is inclined by 24° in a year in a right-to-left direction in the figure. Among the resultant solar light beams, a light beam that is the most rightwardly inclined is difficult to collect into the photovoltaic module 4 arranged on the right-hand side in the cross sectional plane in FIG. 23. Accordingly, the inclination angles of the inclined planes have been set so that the light beam inclined to the right by 24° will surely be collected into the photovoltaic element 4. An inclination angle 20 of this light beam is equal to 24°. The formulae (3), (4) give θ1=15.7°. Thus, in order that a light beam, which has entered a left edge of the light reflecting inclined plane 5S-1L situated on the far-left side with the inclination angle 20 of 24°, enters a left edge of the photovoltaic element 4, the formula (5) requires that 2×3/10=tan (θ4) should hold, and the formula (4) gives θ4=90+15.7−2×θ3. Solving these equations for θ3 gives θ3=37.4°. Namely, it is required to set to be 37.4° the inclination angle of the inclined plane 5S-1L on the far-left side toward the module light-receiving plane 2. However, by taking the manufacturing error into consideration, the inclination angle has been taken as 39°. Next, concerning an inclination angle of the leftwardly ascending inclined plane 5S-2L on the immediate right side of the inclined plane 5S-1L, a distance between a left edge of this inclined plane and a left edge of the photovoltaic element 4 is 7.5 mm. Thus, replacing 5 mm in the above-mentioned calculation by 7.5 mm, calculating the inclination angle results in 33.5°. Then, by taking the manufacturing error into consideration, the inclination angle has been set to be 35°. The inclination angles of the respective leftwardly ascending inclined planes have been set as explained above. Also, inclination angles of the rightwardly ascending inclined planes opposed to the leftwardly ascending inclined planes have been calculated in the same way, using distances between the rightwardly ascending inclined planes and the solar photovoltaic element 4 arranged on the left-hand side thereof.

Figure 24:
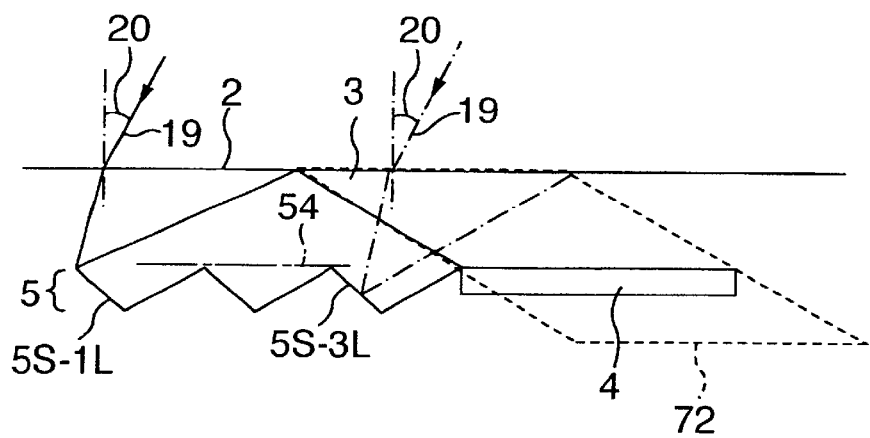
FIG. 24 is a cross sectional view of the light concentrator photovoltaic module according to another embodiment of the present invention.

FIG. 24 illustrates, in the above-described cross sectional plane, a structure of a light concentrator photovoltaic module according to another embodiment of the present invention. In this structure, the leftwardly ascending inclined planes in the groove-shaped light reflecting plane differs from the rightwardly ascending inclined planes in their inclination angles toward the module light receiving plane 2. Basically, this design of the inclination angles in the light reflecting plane has been made in order to effectively collect an incident light beam 19 that is inclined to the right in the figure. In order to effectively collect the light beam like this having an incident angle 20, it is required to make larger the inclination angle of the leftwardly ascending inclined planes 5S-1L to 5S-3L so that the incident light beam 19, after being reflected by the light reflecting plane 5, undergoes total internal reflection on the module light receiving plane 2. An acrylic resin has been used as the medium 3, and thus a refractive index of the medium 3 is equal to 1.5. Also, the design has been made so that the incident light beam 19 having an incident angle of, mainly, 30° can be collected effectively. The inclination angle of the leftwardly ascending inclined planes 5S-1L to 5S-3L with respect to the module light receiving plane 2 has been taken as 35°. Accordingly, based on the formulae (7), (8), when a distance between the vertex plane 54 of the light reflecting plane and the front surface of the module is taken as 3 mm, width of the light reflecting plane has been set to be 7.29 mm.

Figure 25:
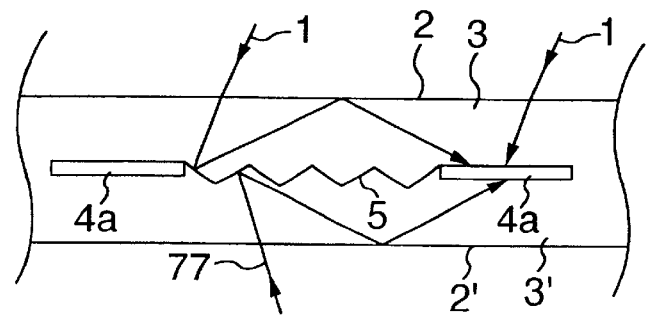
FIG. 25 is a cross sectional view of the light concentrator photovoltaic module according to another embodiment of the present invention.

FIG. 25 illustrates, in the above-described cross sectional plane, a structure of a light concentrator photovoltaic module according to another embodiment of the present invention. In this structure, based on the structure in FIG. 17A, 17B, the photovoltaic element 4a is replaced by the double-sided light receiving type photovoltaic element, and the groove-shaped light reflecting plane 5 is replaced by a double-sided light reflecting light reflecting plane, and in addition a medium 3' is provided on the back surfaces of them as well. This has made it possible to effectively collect a light beam 1 incoming from the front surface of the module and a light beam 77 incoming from the back surface thereof.

Figure 3C:
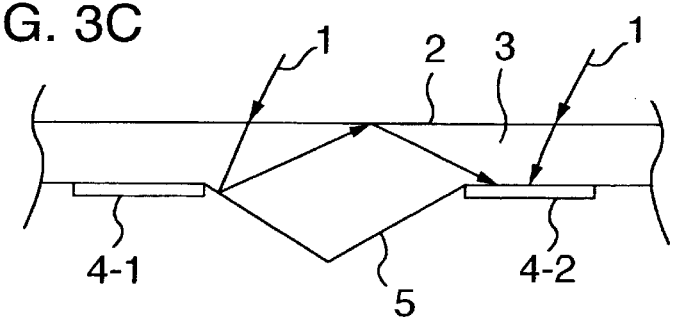
Figure 3D:
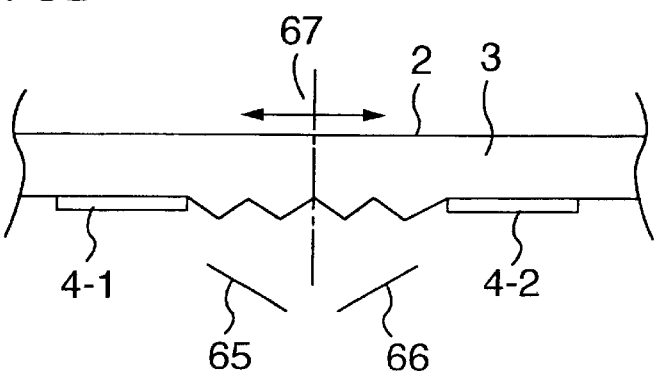
Figure 26A:
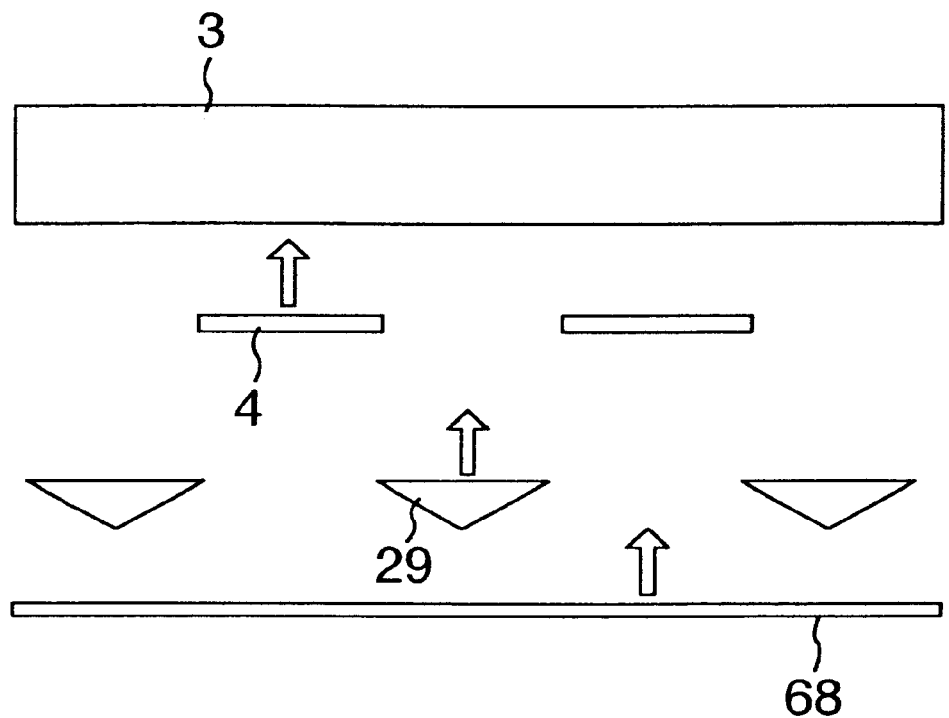
FIGS. 26A and 26B are diagrams illustrating one fabricating process of the light concentrator photovoltaic module according to another embodiment of the present invention.
Figure 26B:
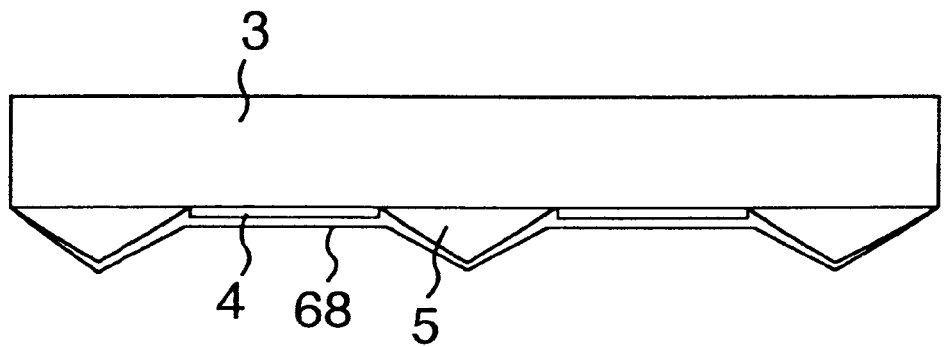

FIGS. 26A, 26B illustrate, in the above-described cross sectional plane, a structure of a light concentrator photovoltaic module according to another embodiment of the present invention. In this structure, the structure illustrated in FIG. 3C is employed. First, a flat plate-shaped glass plate that is 3 mm thick is used as a medium 3, and then second mediums 29 and photovoltaic elements 4 are bonded onto the medium 3 with the use of the EVA. Here, the second medium 29 is obtained by shaping an acrylic resin into a substantially triangular prism-like configuration. Width of the acrylic medium 29 (i.e., length in a transverse direction in the figure) has been taken as 10.4 mm, and an opening angle in the upper portion has been set to be 120°. After that, a reflection sheet 68 is bonded onto the entire back surface. Although the detailed explanation is omitted concerning a method of fabricating electrical interconnections connected from the photovoltaic elements 4, there have been used the method explained in the above-described embodiments.

Figure 27A:
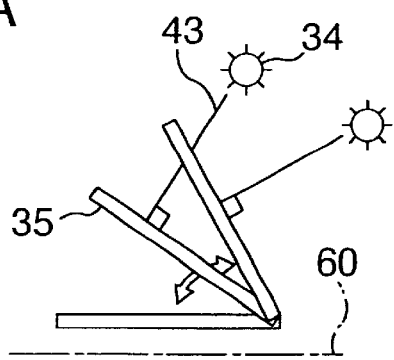
FIGS. 27A to 27D are diagrams illustrating one structure of the light concentrator photovoltaic system according to another embodiment of the present invention.
Figure 27B:
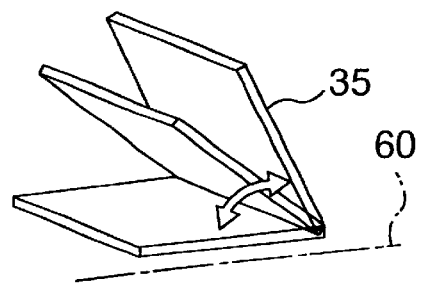
Figure 27C:
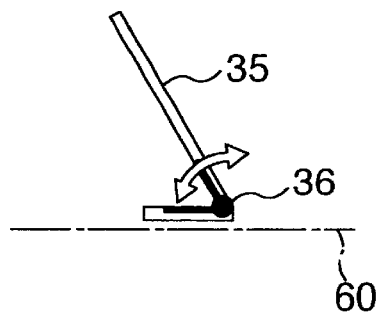
Figure 27D:
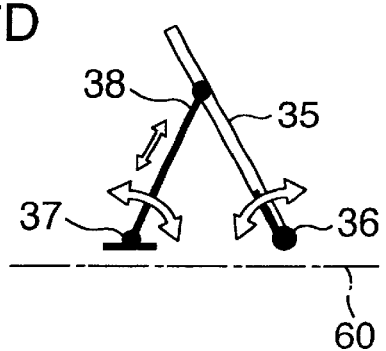

FIGS. 27A to 27D illustrate a structure of a light concentrator photovoltaic system according to an embodiment of the present invention. As described earlier, it is required to change a direction of the module light receiving plane so that the line perpendicular to the module light receiving plane is oriented in a direction of the sun 34. For this purpose, as illustrated in FIGS. 27A, 27B, it is required to present a structure where, when a light concentrator photovoltaic module 35 is arranged on the earth ground, the inclination thereof is variable toward a horizontal plane 60. In order to attain this, as illustrated in FIG. 27C, a hinge has been provided, thereby presenting the structure that permits the inclination angle of the light concentrator photovoltaic module 35 to be arbitrarily set depending on the inclination of the sun. Also, as illustrated in FIG. 27D, an extendable supporting rod 38 connected to a hinge 37 on a supporting base is used, thereby making it possible to set the inclination angle securely.

Figure 28A:
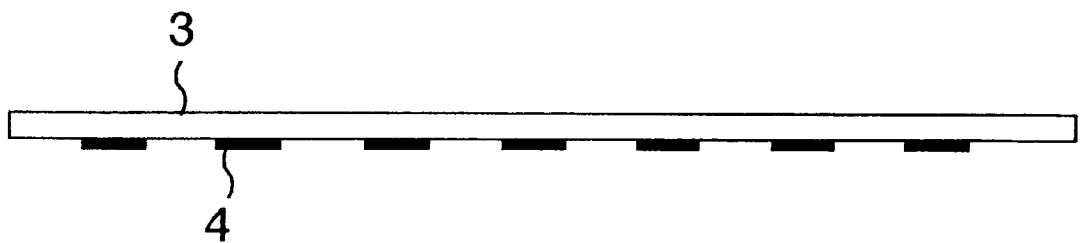
FIGS. 28A to 28C are diagrams illustrating one structure of the light concentrator photovoltaic module according to another embodiment of the present invention.
Figure 28B:
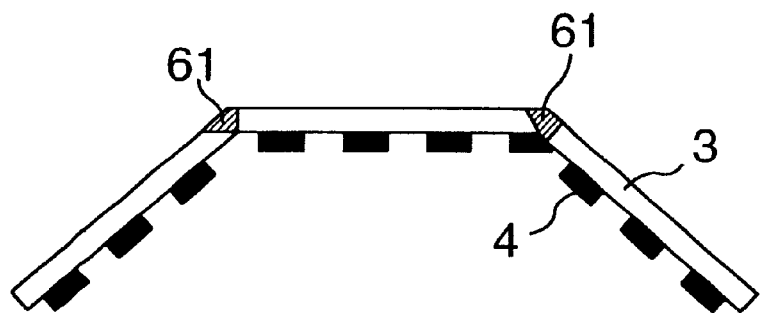
Figure 28C:
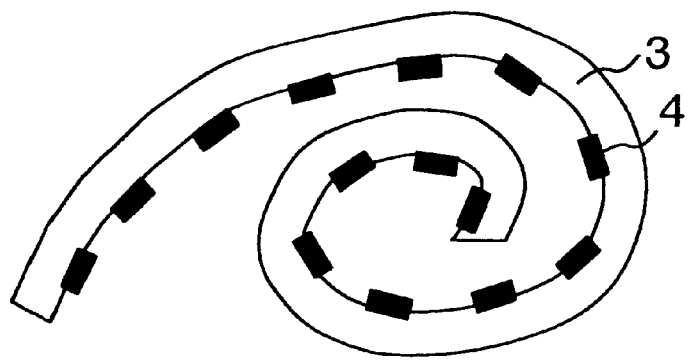

FIGS. 28A to 28C illustrate a structure of a light concentrator photovoltaic module according to another embodiment of the present invention. The explanation has been given until now concerning the case where the module light-receiving plane is a flat plane. However, the manufacturing of the light concentrator photovoltaic module in the present embodiment costs less in comparison with that of the conventional photovoltaic module, and the following applications can be considered as the use of such a module: Arranging the module on the surface of a curved plane-shaped roof or wall that is not the most suitable for the conventional photovoltaic power generation, and carrying the module for leisure in a state of being folded or rolled and spreading it and generating power in a place in which to generate the power, and so on. For example, in order for the module to be able to be folded, as illustrated in FIG. 28B, portions of a medium 3 in the light concentrator photovoltaic module should be formed with a soft material so that the portions can be bent. For this purpose, the flat plate-shaped medium 3 is fabricated with glass, and the portions 61 to be bent are fabricated with a silicon resin or the EVA. This has made it possible to form a light concentrator photovoltaic module that can be bent by about 40°. Also, the medium 3 has been composed of a transparent and highly flexible material such as flexible type polyvinyl chloride and an olefin-series resin, thereby making it possible to manufacture a light concentrator photovoltaic module that can be rolled as illustrated in FIG. 28C. In these light concentrator photovoltaic modules, when they are spread out in a flat plane-like manner, the module light receiving plane and the photovoltaic elements and the light reflecting plane should be located in the position relationship according to the above-described embodiments. Also, by using the module in a state of not being completely spread out but being warped to some extent, the module has become usable on the curved plane-shaped roof or wall and, what is more, on a sunroof of an automobile as well, although there has been found a slight amount of decrease in the light collection efficiency.

Figure 29A:
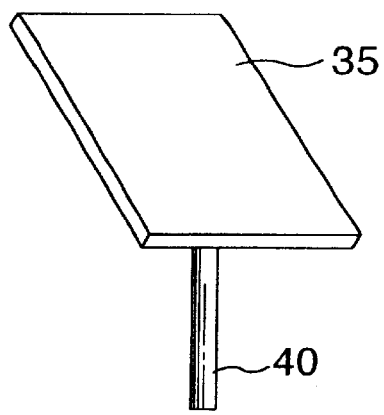
FIGS. 29A and 29B are diagrams illustrating one structure of the light concentrator photovoltaic system according to another embodiment of the present invention.
Figure 29B:
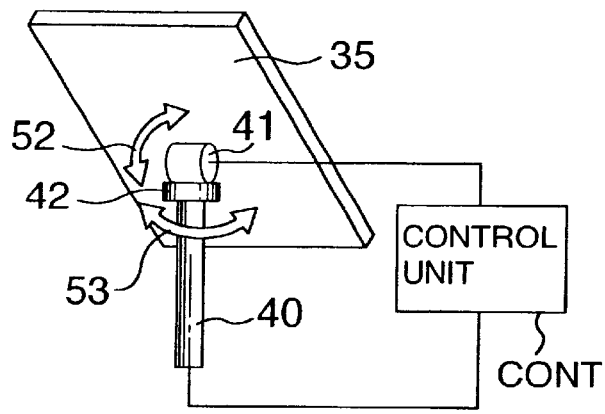

FIGS. 29A, 29B illustrate a structure of a light concentrator photovoltaic system according to another embodiment of the present invention. In the light concentrator photovoltaic system according to the present embodiment, a light concentrator photovoltaic module is set in such a manner that the module light receiving plane is directed toward the sun, namely, the normal of the module light receiving plane is oriented toward the sun. This enhances the light collection efficiency up to the highest possible degree. Thus, as illustrated in FIGS. 29A, 29B, the sun is tracked in the following way: A control apparatus CONT controls a vertical direction rotation mechanism 41 and a horizontal direction rotation mechanism 42 adjust a vertical direction inclination 52 and a horizontal direction rotation 53 in correspondence with the movement of the sun, thereby allowing the sun to be tracked. This has made it possible to always direct the module light receiving plane toward the sun in correspondence with the movement of the sun due to variations in the annual solar altitude or the daily solar azimuth. Accordingly, it has become possible to always obtain a light collection efficiency that is close to 100%. In the light concentrator photovoltaic module according to the present invention, as illustrated in FIGS. 11B, 11C as the examples thereof, if the normal of the module light-receiving plane is inclined by about, for example, 5° from the direction of the sun, there occurs no significant decrease in the light collection efficiency. Thus, when the above-described tracking accuracy, which conventionally has been equal to ±1°, is relaxed up to ±5°, there has occurred absolutely no decrease in the optical efficiency. Also, even when the above-described tracking accuracy is relaxed up to ±10°, the decrease in the optical efficiency has been found to be −5%. Consequently, in this tracking system, making the tracking accuracy larger than the conventional value of ±1° as permitted a manufacturing cost of the tracking system to be reduced. It Is required, however, that width of the tracking accuracy should be held within ±10° or, preferably, ±5°. Numeral 40 represents a post for supporting the module 35.

Figure 30A:
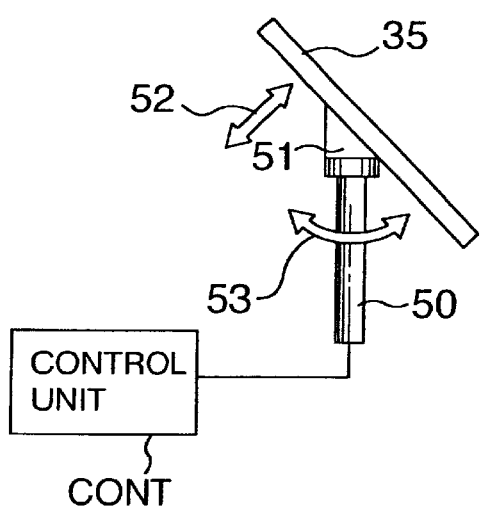
FIGS. 30A to 30C are diagrams illustrating one structure of the light concentrator photovoltaic system according to another embodiment of the present invention.
Figure 30B:
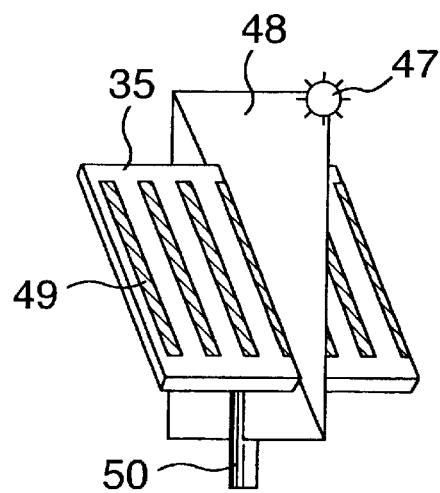
Figure 30C:
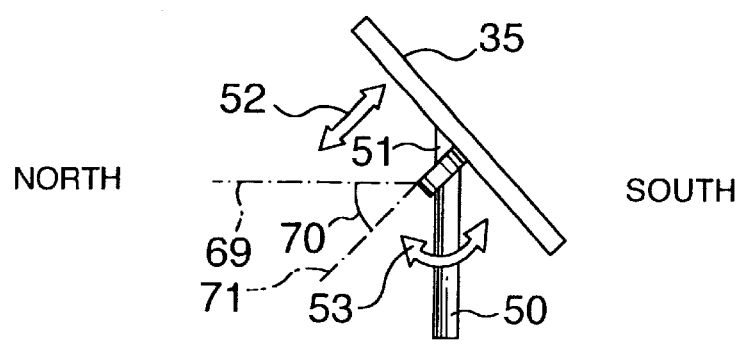

FIGS. 30A to 30C illustrate a structure of a light concentrator photovoltaic system according to another embodiment of the present invention. In a conventional light concentrator photovoltaic module with a high concentration ratio in which the concentration ratio is enhanced more than ten times greater with the use of Fresnel lenses and so on, it is almost impossible to collect an incident light beam if the incident angle thereof is inclined by just 5°. Accordingly, it is required to always track the sun precisely so that the module light-receiving plane is oriented toward the sun. In contrast to this situation, in the light concentrator photovoltaic module according to the present invention, as illustrated in FIGS. 11B, 11C as the examples thereof, if the normal of the module light receiving plane is inclined by about, for example, 5° from the direction of the sun, there occurs no significant decrease in the light collection efficiency. Consequently, it becomes possible to relax the tracking accuracy if the light concentrator photovoltaic module according to the embodiment of the present invention is employed in a tracking type photovoltaic system using a control mechanism that tracks the movement of the sun so that the module light receiving plane is always directed toward the sun. Also, there occurs almost no change in the light collection efficiency toward an inclination angle of an incident light beam in a direction parallel to the grooves in the groove-shaped light reflecting plane in the light concentrator photovoltaic module according to the embodiment of the present invention. Thus, as illustrated in FIGS. 30A, 30B, a control apparatus CONT controls a horizontal direction rotation mechanism 42 in such a manner that only a horizontal direction rotation 53 is effected with the inclination angle in the vertical direction normally kept unchanged by use of the vertical direction supporting portion 51 and the horizontal direction rotation mechanism 42, so that the sun is positioned in a virtual plane 48 parallel to the grooves of the light reflecting plane and perpendicular to the module light receiving plane of the light concentrator photovoltaic module. The above-described control has made a vertical direction rotation mechanism unnecessary, thus making it possible to reduce a manufacturing cost of this light concentrator photovoltaic system. Also, the light collection efficiency of the photovoltaic module has been substantially equal to that of the photovoltaic module in the photovoltaic system using the 2-axis tracking system illustrated in FIGS. 29A, 29B. Also, the vertical direction inclination angle 52 has been adjusted several times a year depending on the seasons, thereby allowing the annual power generation amount to be enhanced even further. Also, as illustrated in FIG. 30C, a rotation plane 71 of the horizontal direction rotation mechanism 42 has been set in a state of being inclined by an angle 70 from a horizontal plane 69 to a north-south direction, thereby allowing the light collection efficiency to be enhanced even further. Here, the angle 70 is equal to latitude of the position at which the module has been set. In this structure, too, when the above-described tracking accuracy, which conventionally has been equal to ±1°, is relaxed up to ±5°, there has occurred absolutely no decrease in the optical efficiency. Also, even when the above-described tracking accuracy is relaxed up to ±10°, the decrease in the optical efficiency has been found to be −5%. Consequently, in this tracking system, making the tracking accuracy larger than the conventional value of ±1° has permitted the manufacturing cost of the tracking system to be reduced. It is required, however, that width of the tracking accuracy should be held within ±10° or, preferably, ±5°. Numeral 50 represents a post for supporting the module 35.

Figure 31A:
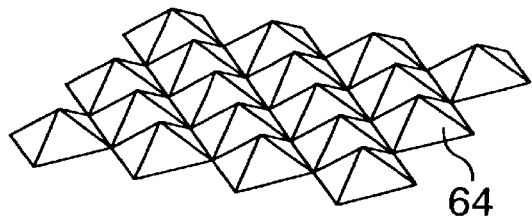
FIGS. 31A to 31D are diagrams illustrating one structure of the light concentrator photovoltaic module according to another embodiment of the present invention.
Figure 31B:
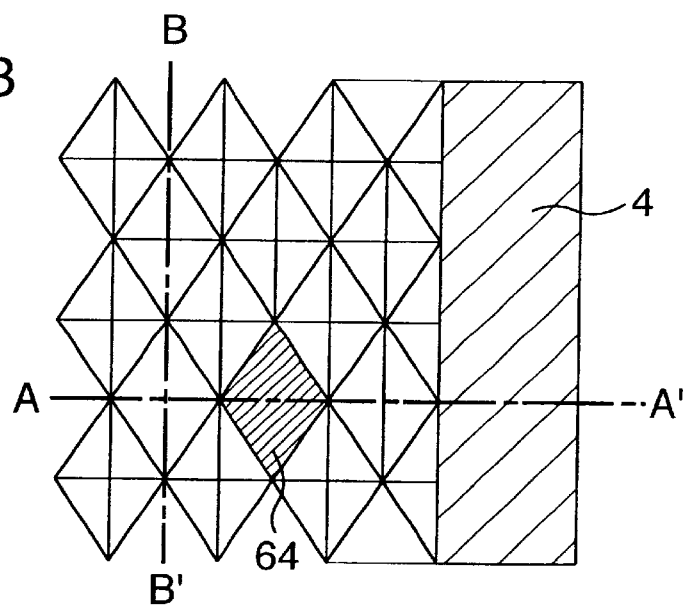
Figure 31C:
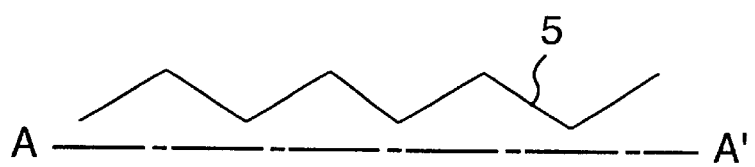
Figure 31D:
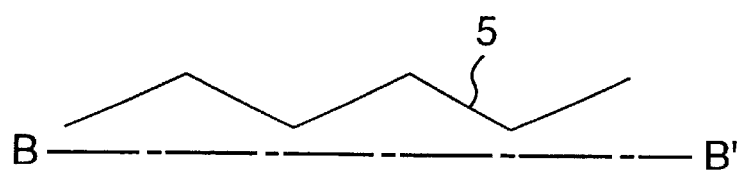

FIGS. 31A to 31D illustrate a structure of a light concentrator photovoltaic system according to another embodiment of the present invention. As explained in FIGS. 10A, 10B, the formation of the secondary grooves on the light reflecting plane is effective for enhancing the light confinement efficiency. It is not at all easy, however, to form the microscopic secondary grooves on the inclined planes of the larger primary grooves at a low cost. Thus, at this time, it can be considered to make the secondary grooves larger in size. When, in this way, depth of the secondary grooves is made equal to that of the primary grooves, a configuration of the light reflecting plane becomes a one consisting of combinations of quadrilateral pyramid-like figures. As a structure that is the easiest to form and results in the highest light collection efficiency among the combinations of the quadrilateral pyramids, a structure obtained by arranging quadrilateral pyramid-like light reflecting planes 64 has been employed, as illustrated in a bird' eye view in FIG. 31A. The structure illustrated in FIG. 21C is used as the other portion in the present embodiment. FIG. 31B illustrates a diagram of the quadrilateral pyramid-like light reflecting planes 64 and the photovoltaic element 4 seen from the upper side thereof. A–A' direction in this drawing is a direction equivalent to the direction of the secondary grooves. FIG. 31C is a cross sectional view of the light reflecting plane 5 in a cross sectional plane that includes lines connecting vertex points of the quadrilateral pyramids in A–A' direction and is perpendicular to the light receiving plane. An angle of these inclined planes toward the module light receiving plane has been set to be 30°. Also, FIG. 31D is a cross sectional view of the light reflecting plane 5 in a cross sectional plane that includes lines connecting the vertex points of the quadrilateral pyramids in B–B' direction and is perpendicular to the light receiving plane. Here, B-B' direction is a direction equivalent to the direction of the primary grooves. An inclination of these inclined planes is equivalent to the inclination of the inclined planes in the secondary grooves. In the present embodiment, the inclination has been set to be 15°. The formation of such a structure has made it possible to make 89% the light collection efficiency toward the annual sunlight amount in the case where the concentration ratio is equal to 2.5.

In the above-described embodiments, a sheet-shaped shaped material such as of copper has been used as the substrate material on which the light reflecting member is formed. However, it is allowable to employ a substrate such as a plastic resin substrate such as of an acrylic resin, PET, polycarbonate and a fluoric resin, a metal substrate such as aluminum, an aluminum alloy, a stainless alloy and kovar, or a metal oxide substrate such as of alumina and a surface-oxidized aluminum, all having a high weather protection and a sufficient mechanical strength. Hereafter, explanation will be given concerning an embodiment in which the aluminum substrate is used.

Figure 32:
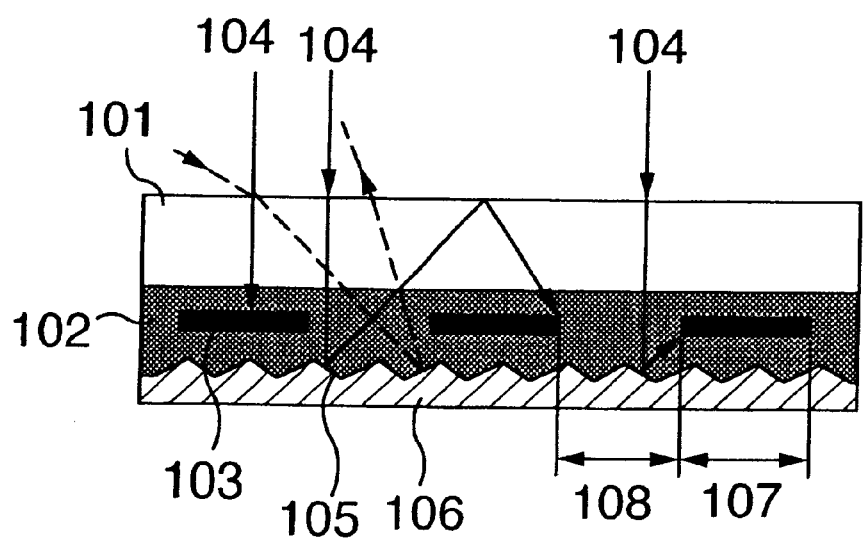
FIG. 32 is a cross sectional view of the light concentrator photovoltaic module according to another embodiment of the present invention.

FIG. 32 illustrates, in the above-described cross sectional plane, a structure of a light concentrator photovoltaic module according to another embodiment of the present invention. In FIG. 32, a transparent resin layer 102 using an ethylene-vinyl acetate copolymer (commonly called EVA) has a function of bonding a transparent substrate 101, which is about 3 mm thick and is composed of glass, with photovoltaic elements 103 (commonly called cell). Also, the transparent resin layer has an operation of bonding and supporting a V-like groove-shaped light reflecting layer described hereinafter. Solar batteries using Si are employed as the photovoltaic elements. The solar battery is 100 mm long in the lengthwise direction of the grooves, and a length 107 of the solar battery in a transverse direction in the figure is equal to 25 mm, and an arrangement spacing therebetween 108 is equal to 20 mm. This size is just an example, and the solar battery is not necessarily limited thereto. The explanation will be given below concerning a method of fabricating the above-described light concentrator photovoltaic module. A first EVA sheet which is 0.8 mm thick is placed on the surface of the glass substrate 101, and further the solar batteries 103 interconnected with each other are placed on the first EVA sheet. Then, a laminator apparatus, which exerts a pressure under vacuum evacuation, heating and the atmospheric pressure, is used so as to melt the first EVA sheet, thereby bonding the solar batteries 103 with the glass substrate 101. After that, a second EVA sheet is placed on the solar batteries 103 and on exposed parts of the first EVA sheet, and further an aluminum metal substrate 106 having the V-like groove-shaped light reflecting surface 105 and 0.4 mm thick, is placed on the second EVA sheet. Then, the laminator apparatus is used to melt and harden the first and second EVA sheets to form the EVA sheet 102, thereby completing the light concentrator photovoltaic module.

Conventionally, a fluorocarbon resin-based sheet has been bonded instead of the metal substrate. In the present embodiment, however, the aluminum substrate 106, which is comparatively thick, is located on the outermost surface. This ensures the reliability in the environment resistance.

A sunlight beam 104 that has entered the fabricated photovoltaic module enters the cell 103 directly, then generating electrical energy. Otherwise, the sunlight beam 104 is reflected once by the V-like groove-shaped light reflecting surface 105 and reaches the cell 103 after undergoing total internal reflection on the surface of the glass substrate 101, then generating electrical energy as well. Still otherwise, the sunlight beam 104 is reflected by the V-like groove-shaped light reflecting surface 105 and reaches the back surface of the cell 103, then contributing the photovoltaic power generation. If the total internal reflection condition is not satisfied on the surface of the glass substrate 101, the sunlight beam travels forward in a direction indicated by a dotted line and leaks away into the outside of the solar photovoltaic module, thus making no contribution to the power generation. This means that the sunlight beam has become so-called a loss light, which decreases the light collection efficiency badly. In order to prevent this phenomenon, it is required to make smaller an opening angle of the V-like grooves of the light reflecting surface 105. If, however, the opening angle is made too small, there occurs a double reflection on the light reflecting surface 105. Consequently, it is desirable to set the opening angle of the V-like grooves to be 120°±10°. In the present embodiment, the aperture angle is set to be 120°, and a pitch of the V-like grooves is set to be 0.2 mm.

In order to enhance the light collection efficiency, it is required to enhance a reflectance of the light reflecting surface 105. For this purpose, it is effective to coat the aluminum substrate 106 with a film of substance such as silver or high-purity aluminum and to employ the coated aluminum substrate as the light reflecting surface 105. Also, in order to enhance the reflectance even further, there can be provided a method of forming an interference film on the surface of the film. As this interference film, there can be used a single-layered thin film having a refractive index smaller than that of the transparent resin layer 102 or the glass substrate 101. More preferably, as the interference film, it is necessary to use a film obtained by overlaying a material with a low refractive index and a material with a high refractive index periodically. As an example, a film may be used that is obtained by evaporating the high-purity aluminum onto the aluminum substrate 106 and laminating thereon a layer of $SiO_2$ (a material with a low refractive index) and that of $TiO_2$ (a material with a high refractive index) alternately.

The configurations of the elements such as the photovoltaic elements and the light reflecting planes have been specified in the explanation until now. In the actual manufacturing, however, their surfaces may be uneven or warped. Also, although there are some cases where, from the conveniences in the manufacturing, there are used configurations that are partially shifted from the above-mentioned configurations, it is needless to say that the effects in the present invention can be obtained in these cases as well. Also, the transparent resin or the glass has been employed as the above-described medium, and refractive indexes of these materials usually fall in the range of 1.45 to 1.55. Also, the photovoltaic module is, usually, used in the air, and in addition a refractive index of the air is equal to 1. Accordingly, it turns out that the refractive index of the medium is larger than that of the outside of the photovoltaic module, and the ratio therebetween is commonly equal to about 1.5. In this way, when the refractive index of the medium is larger than that of the outside, it becomes possible to enhance the light collection efficiency of the photovoltaic module further. Also, as the ratio between the refractive indexes becomes larger, it becomes possible to enhance the light collection efficiency even further. Consequently, in the case where the medium includes a plurality of mediums as well, it is required to make refractive indexes of all the mediums as large as possible. Also, in order to prevent a total internal reflection from occurring on the interface between the adhesive agent layer and the medium, it is desirable to use, as the adhesive agent layer, a material the refractive index of which is close to that of the medium. Also, concerning the flat plate-shaped photovoltaic element and the thick plate-shaped photovoltaic element used in the explanation described earlier, it has been simply described conceptually that the two photovoltaic elements differ from each other in the ratio between the thickness and the width thereof. When a plane that is capable of converting incident sunlight into electrical power effectively is defined as a light receiving plane, it becomes a more important factor in the present invention whether or not the side surfaces and the back surface of the photovoltaic element are the light receiving planes. Namely, it is not at all essential whether the cross sectional configuration of the photovoltaic element is flat plate-shaped, thick plate-shaped, or cube-shaped. Thus, in the present invention, it is not important to distinguish these configurations quantitatively. Also, it is needless to say that the similar effects can be obtained using, instead of the cube-shaped photovoltaic module, a configuration in which the corners thereof are cut off or a photovoltaic element the cross sectional plane of which is circular in shape. Also, it goes without saying that, even if the elements, such as the medium, the photovoltaic elements and the light reflecting planes in the various types of structures explained until now, are used in a combination modified as compared with the combinations in the structures, the light concentrator photovoltaic module with the high light collection efficiency can also be obtained on account of the respective effects. Also, although omitted in the above-described explanation, it goes without saying that, from the viewpoint of a commercial product, it is necessary to fix a frame, which is composed of a metal or a resin, on the periphery of the above-mentioned light concentrator photovoltaic module with the use of a resin-sealing material and so on, or to install an electrode terminal box on the back surface of the module.

The above-described embodiment makes it possible to embody the light concentrator photovoltaic module that is easy to manufacture and has a high light collection efficiency.

What is claimed is:

1. A light concentrator photovoltaic module comprising a flat module light receiving plane upon which sunlight is incident, a plurality photovoltaic elements, a light reflecting member, and a medium for transmitting the sunlight to said photovoltaic elements and said light reflecting member, wherein said module light receiving plane is formed by a surface of said medium upon which the sunlight is incident, and said medium and said light reflecting member are joined with each other so that their interface forms a light reflecting plane;

wherein, with said module light receiving plane and said photovoltaic elements being located at a relatively upper level and at a relatively lower level, respectively, said light reflecting plane includes, between adjacent two photovoltaic elements, at least two first inclined planes and at least two second inclined planes, said first inclined planes being rightwardly ascending while said second inclined planes are leftwardly ascending, respectively, as viewed on a cross section taken on a line on which the adjacent two photovoltaic elements lie, at least two first inclined planes being arranged on a right side of a middle point of a distance between said adjacent two photovoltaic elements while at least two second inclined planes being arranged on a left side of said middle point; and wherein a portion of said light reflecting plane including said first and second inclined planes between said adjacent two photovoltaic elements is arranged relative to one of said two adjacent photovoltaic elements which is on a right side in such a manner that said one photovoltaic element has a light receiving plane at least partly positioned within a parallelogramic area, as viewed on said cross section, consisting of first to fourth sides, the first side defined by a first reflection light beam produced by a sunlight beam entering a left edge of a most leftwardly located one of said second inclined planes of said portion of said light reflecting plane and undergoing total internal reflection on said module light receiving plane, the second side defined by a second reflection light beam produced by said sunlight beam entering a most rightwardly located one of said second inclined planes of said portion of said light reflecting plane and arriving at and undergoing total internal reflection on said module light receiving plane without impinging on an opposed one of said first inclined planes, the third side defined by a line on which points of said total internal reflection of said first and second reflection light beams on said module light receiving plane lie, and the fourth side defined by a line farther from said module light receiving plane than a plane containing the uppermost portions of said first and second inclined planes of said portion of said light receiving plane, wherein adjacent first and second inclined planes of said light reflecting plane are in contact to each other on an individual one side to form a groove so that said light reflecting plane provides a groove-formed reflection sheet, and a width between adjacent grooves as viewed in a direction parallel to the light receiving plane on said cross section is no less than 1 mm.

2. A light concentrator photovoltaic module comprising a flat module light receiving plane upon which sunlight is incident, a plurality photovoltaic elements, a light reflecting member, and a medium for transmitting the sunlight to said photovoltaic elements and said light reflecting member, wherein said module light receiving plane is formed by a surface of said medium upon which the sunlight is incident, and said medium and said light reflecting member are joined with each other so that their interface forms a light reflecting plane;

wherein, with said module light receiving plane and said photovoltaic elements being located at a relatively upper level and at a relatively lower level, respectively, said light reflecting plane includes, between adjacent two photovoltaic elements, at least two first inclined planes and at least two second inclined planes, said first inclined planes being rightwardly ascending while said second inclined planes are leftwardly ascending, respectively, as viewed on a cross section taken on a line on which the adjacent two photovoltaic elements lie, at least two first inclined planes being arranged on a right side of a middle point of a distance between said adjacent two photovoltaic elements while at least two second inclined planes being arranged on a left side of said middle point; and wherein a portion of said light reflecting plane including said first and second inclined planes between said adjacent two photovoltaic elements is arranged relative to one of said two adjacent photovoltaic elements which is on a right side in such a manner that said one photovoltaic element has a light receiving plane at least partly positioned within a parallelogramic area, as viewed on said cross section, consisting of first to fourth sides, the first side defined by a first reflection light beam produced by a sunlight beam entering a left edge of a most leftwardly located one of said second inclined planes of said portion of said light reflecting plane and undergoing total internal reflection on said module light receiving plane, the second side defined by a second reflection light beam produced by said sunlight beam entering a most rightwardly located one of said second inclined planes of said portion of said light reflecting plane and arriving at and undergoing total internal reflection on said module light receiving plane without impinging on an opposed one of said first inclined planes, the third side defined by a line on which points of said total internal reflection of said first and second reflection light beams on said module light receiving plane lie, and the fourth side defined by a line farther from said module light receiving plane than a plane containing the uppermost portions of said first and second inclined planes of said portion of said light receiving plane, wherein said module light receiving plane includes first and second module light reception planes forming opposite surfaces of said medium, said first module light reception plane being located at said relatively upper level, each of said photovoltaic elements having first and second element light receiving planes, said first element light receiving plane being provided on a first side of the photovoltaic element on which said first module light reception plane exists, said second element light receiving plane being provided on a second side of the photovoltaic element on which said second module light reception plane exists, and said light reflecting plane enables light reflection on both sides thereof.

3. A light concentrator photovoltaic module according to claim 2, wherein said plurality of photovoltaic elements are flat elements.

4. A light concentrator photovoltaic module according to claim 2, wherein adjacent first and second inclined planes of said light reflecting plane are in contact to each other on individual one side to form a groove, a plurality of grooves being provided by said first and second inclined planes in contact to each other.

5. A light concentrator photovoltaic module according to claim 2, wherein adjacent first and second inclined planes of said light reflecting plane are in contact to each other on individual one side to form a groove, said groove having an angle of 120°±10°.

6. A light concentrator photovoltaic module according to claim 2, wherein a portion of said light reflecting plane including said first and second inclined planes between said adjacent two photovoltaic elements is arranged, as viewed on said cross section, relative to one of said two adjacent photovoltaic elements which is on a right side in such a manner that a part of said second inclined planes leftwardly ascending in said portion of said light reflecting plane have inclination angles with respect to module light receiving plane are gradually decreasing as locations of the second inclined planes approach nearer to said photovoltaic element.

7. A light concentrator photovoltaic module according to claim 2, wherein said light reflecting plane is provided in the form of said inclined planes continuously extending to a side opposite to a module light receiving plane side of said plurality of photovoltaic elements.

8. A light concentrator photovoltaic module according to claim 2, wherein said light reflecting plane is provided to continuously extend between said plurality of photovoltaic elements on a side opposite to a module light receiving plane side of said plurality of photovoltaic elements, a part of said light reflecting plane, on which the photovoltaic element is projected, having a shape of a curved line or a broken line similar to said curved line as viewed on a cross section taken along a line on which projections of adjacent two photovoltaic elements lie.

9. A light concentrator photovoltaic module according to claim 2, wherein said light reflecting plane is discontinuous in a direction of a line on which said plurality of photovoltaic elements lie.

10. A light concentrator photovoltaic module according to claim 2, wherein said adjacent first and second inclined planes of said light reflecting plane are in contact to each other on individual one side to form a said groove having an angle of 120°±10°.

11. A light concentrator photovoltaic module according to claim 2, wherein said adjacent first and second inclined planes of said light reflecting plane are in contact to each other on individual one side to form a groove, said light reflecting plane including an array of a plurality of quadrangular pyramids with recesses and projections in a direction of the length of said groove.

12. A light concentrator photovoltaic module according to claim 2, wherein said adjacent first and second inclined planes of said light reflecting plane are in contact to each other on individual one side to form a groove, with recesses and projections additionally formed in a direction of the length of said groove.

13. A light concentrator photovoltaic module according to claim 2, wherein said module is being capable of being folded or rolled up.

14. A light concentrator photovoltaic module according to claim 2, wherein said light reflecting plane is formed on a resin substrate, a metal substrate or a metal oxide substrate.

15. A light concentrator photovoltaic module according to claim 14, wherein said resin substrate is made of a material selected from a group consisting of acrylic resin, PET, polycarbonate and a fluoric resin, said metal substrate is made of a material selected from a group consisting of aluminum, an aluminum alloy, copper, a stainless alloy and kovar, and said metal oxide substrate is made of a material selected from a group consisting of alumina and surface oxidized-aluminum.

16. A light concentrator photovoltaic module according to claim 14, wherein said metal substrate is an aluminum substrate, said light reflecting plane is made from said aluminum substrate itself or from said aluminum substrate and an aluminum film formed on said aluminum substrate, and an interference film is further formed on said light reflecting plane to enhance a reflectance of said light reflecting plane.

17. A light concentrator photovoltaic system comprising the photovoltaic module defined in claim 2, and an angle varying means for varying an inclination angle of said photovoltaic module with respect to a horizontal plane.

18. A light concentrator photovoltaic system comprising an artificial satellite, and the photovoltaic module defined in claim 2, said photovoltaic module being mounted on said artificial satellite.

19. A light concentrator photovoltaic system comprising a two-axis tracking apparatus, and the photovoltaic module defined in claim 2.

20. A light concentrator photovoltaic system comprising a single axis tracking apparatus, the photovoltaic module defined in claim 2 installed in said single axis tracking apparatus, and control means for controlling said photovoltaic module in such a manner that the sun is located in a virtual plane perpendicular to said module light receiving plane and parallel with a direction of the length of a groove formed by adjacent first and second inclined planes in contact with each other on individual one side.

21. A method of manufacturing the photovoltaic module as defined in claim 2, comprising preparing separately at least a part of said medium and said light reflecting plane, and said medium and said light reflecting plane with each other.

* * * * *